(12) United States Patent
Huizinga et al.

(10) Patent No.: US 8,968,629 B2
(45) Date of Patent: Mar. 3, 2015

(54) APPARATUS AND METHOD FOR PRODUCING TWO-SIDED PATTERNED WEB IN REGISTRATION

(71) Applicants: 3M Innovative Properties Company, St. Paul, MN (US); Thelma E. Hunter, St. Paul, MN (US)

(72) Inventors: John S. Huizinga, White Bear Lake, MN (US); John T. Strand, Stillwater, ME (US); James N. Dobbs, Woodbury, MN (US); Thomas B. Hunter, St. Paul, MN (US); William V. Dower, Austin, TX (US); Daniel H. Carlson, Arden Hills, MN (US); Serge Wetzels, Bergeijk (NE); Gregory F. King, Minneapolis, MN (US); Olester Benson, Jr., Woodbury, MN (US); Jeremy K. Larsen, Farmington, MN (US); Michael Benton Free, St. Paul, MN (US); David W. Kuhns, Monrovia, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/270,838

(22) Filed: May 6, 2014

(65) Prior Publication Data

US 2014/0239555 A1    Aug. 28, 2014

Related U.S. Application Data

(62) Division of application No. 12/837,826, filed on Jul. 16, 2010, now Pat. No. 8,740,599, which is a division of application No. 11/370,136, filed on Mar. 6, 2006, now Pat. No. 7,767,273.

(60) Provisional application No. 60/661,430, filed on Mar. 9, 2005.

(51) Int. Cl.
*B29C 59/04* (2006.01)
*B29C 59/16* (2006.01)
(Continued)

(52) U.S. Cl.
CPC ............ *B29C 59/04* (2013.01); *B29C 35/0888* (2013.01); *B29C 35/0894* (2013.01);
(Continued)

(58) Field of Classification Search
USPC .......................... 264/495; 425/168, 237, 362
See application file for complete search history.

(56) References Cited

U.S. PATENT DOCUMENTS 3,241,429 A   3/1966 Rice
3,374,303 A   3/1968 Metz, Jr.
(Continued)

FOREIGN PATENT DOCUMENTS

CA    2155850    8/1994
CA    2244324    2/1999
(Continued)

OTHER PUBLICATIONS

Lindvold, "UV-Assisted Rotational Molding of Microstructures using a Conventional Flexographic Printing Machine", *Proceedings of SPIE*, vol. 4984, pp. 46-53, (2003).
(Continued)

*Primary Examiner* — Ryan Ochylski
(74) *Attorney, Agent, or Firm* — Gregory D. Allen

(57) ABSTRACT

An apparatus for casting a patterned surface on both sides of an opaque web. The apparatus includes a first patterned roll, a second pattered roll, and a means for rotating the first and second patterned rolls such that their patterns are transferred to opposite sides of the opaque web while it is in continuous motion. During this process, their patterns are maintained in continuous registration to within at least 100 micrometers.

3 Claims, 20 Drawing Sheets

(51) Int. Cl.
*B29C 35/08* (2006.01)
*B29C 39/14* (2006.01)
*B29C 39/20* (2006.01)
*G03F 7/095* (2006.01)
*G03F 7/20* (2006.01)
*H05K 3/00* (2006.01)
*H05K 3/10* (2006.01)
*B05D 1/40* (2006.01)
*B05D 3/06* (2006.01)
*B05D 3/12* (2006.01)
*B29C 43/46* (2006.01)
*B29C 59/02* (2006.01)
*H05K 1/03* (2006.01)

(52) U.S. Cl.
CPC .............. *B29C39/148* (2013.01); *B29C 39/203* (2013.01); *B29C 59/046* (2013.01); *G03F 7/0957* (2013.01); *G03F 7/2032* (2013.01); *H05K 3/0079* (2013.01); *H05K 3/101* (2013.01); *B29C 35/0805* (2013.01); *B05D 1/40* (2013.01); *B05D 3/067* (2013.01); *B05D 3/12* (2013.01); *B05D 2252/02* (2013.01); *B29C 2035/0827* (2013.01); *B29C 2043/463* (2013.01); *B29C 2059/023* (2013.01); *H05K 1/0393* (2013.01); *H05K 3/0008* (2013.01); *H05K 2201/0108* (2013.01); *H05K 2203/0113* (2013.01); *H05K 2203/0143* (2013.01); *H05K 2203/1545* (2013.01); *H05K 2203/1572* (2013.01)
USPC ........................................................ 264/495

(56) References Cited

U.S. PATENT DOCUMENTS

| | | | |
|---|---|---|---|
| 3,551,544 A | 12/1970 | Hlinka |
| 3,893,795 A | 7/1975 | Nauta |
| 3,917,772 A | 11/1975 | Hollenbeck |
| 4,078,416 A | 3/1978 | Voorhees |
| 4,177,304 A | 12/1979 | Berry |
| 4,249,878 A | 2/1981 | Komarek |
| 4,280,978 A | 7/1981 | Dannheim |
| 4,414,316 A | 11/1983 | Conley |
| 4,420,502 A | 12/1983 | Conley |
| 4,448,739 A | 5/1984 | Baus |
| 4,469,645 A | 9/1984 | Eigenmann |
| 4,615,090 A | 10/1986 | Baus |
| 4,744,936 A | 5/1988 | Bittner, Jr. |
| 4,781,975 A | 11/1988 | Baus |
| 4,836,874 A | 6/1989 | Foster |
| 4,892,336 A | 1/1990 | Kaule |
| 5,028,361 A | 7/1991 | Fujimoto |
| 5,087,191 A | 2/1992 | Heise |
| 5,164,227 A | 11/1992 | Miekka |
| 5,177,637 A | 1/1993 | Tsukada |
| 5,259,926 A | 11/1993 | Kuwabara |
| 5,330,799 A | 7/1994 | Sandor |
| 5,333,072 A | 7/1994 | Willett |
| 5,393,475 A | 2/1995 | Murasaki |
| 5,425,848 A | 6/1995 | Haisma |
| 5,498,385 A | 3/1996 | Yabusa |
| 5,540,147 A | 7/1996 | Johnson |
| 5,579,164 A | 11/1996 | Chapnik |
| 5,592,332 A | 1/1997 | Nishio |
| 5,598,280 A | 1/1997 | Nishio |
| 5,615,045 A | 3/1997 | Takuma |
| 5,691,846 A | 11/1997 | Benson, Jr. |
| 5,728,449 A | 3/1998 | Steininger |
| 5,759,455 A | 6/1998 | Kamitakahara |
| 5,800,723 A | 9/1998 | Juskey |
| 5,922,238 A | 7/1999 | Savant |
| 6,024,455 A | 2/2000 | O'Neill |
| 6,025,897 A | 2/2000 | Weber |
| 6,074,192 A | 6/2000 | Mikkelsen |
| 6,124,971 A | 9/2000 | Ouderkirk |
| 6,187,250 B1 | 2/2001 | Champagne |
| 6,197,397 B1 | 3/2001 | Sher |
| 6,272,275 B1 | 8/2001 | Cortright |
| 6,272,982 B1 | 8/2001 | Stauffacher |
| 6,280,063 B1 | 8/2001 | Fong |
| 6,325,880 B1 | 12/2001 | Yamashita |
| 6,354,709 B1 | 3/2002 | Campbell |
| 6,358,030 B1 | 3/2002 | Ampulski |
| 6,368,682 B1 | 4/2002 | Fong |
| 6,373,636 B1 | 4/2002 | Conley |
| 6,381,071 B1 | 4/2002 | Dona |
| 6,483,976 B2 | 11/2002 | Shie |
| 6,495,214 B1 | 12/2002 | Prix |
| 6,541,774 B1 | 4/2003 | DeJule |
| 6,550,383 B2 | 4/2003 | Kitai |
| 6,552,848 B2 | 4/2003 | Kobayashi |
| 6,577,358 B1 | 6/2003 | Arakawa |
| 6,592,802 B1 | 7/2003 | Goto |
| 6,628,460 B1 | 9/2003 | Ookawa |
| 6,630,970 B2 | 10/2003 | Trapani |
| 6,724,536 B2 | 4/2004 | Magee |
| 6,767,594 B1 | 7/2004 | Miroshin |
| 6,870,674 B2 | 3/2005 | Ookawa |
| 6,908,295 B2 | 6/2005 | Thielman |
| 6,963,184 B2 | 11/2005 | Carlson |
| 7,101,437 B2 | 9/2006 | Boutilier |
| 7,106,517 B2 | 9/2006 | Olczak |
| 7,121,693 B2 | 10/2006 | Klose |
| 7,140,812 B2 | 11/2006 | Bryan |
| 7,165,959 B2 | 1/2007 | Humlicek |
| 7,224,529 B2 | 5/2007 | King |
| 7,417,798 B2 | 8/2008 | King |
| 7,444,932 B2 | 11/2008 | Strand |
| 7,767,273 B2 | 8/2010 | Huizinga |
| 2001/0030805 A1 | 10/2001 | Sawaki |
| 2001/0038443 A1 | 11/2001 | Anderson |
| 2002/0141790 A1 | 10/2002 | Kamimura |
| 2002/0177082 A1 | 11/2002 | Brady |
| 2002/0196563 A1 | 12/2002 | Itoh |
| 2003/0075262 A1 | 4/2003 | Hein |
| 2003/0075269 A1 | 4/2003 | Prix |
| 2003/0081331 A1 | 5/2003 | Abe |
| 2003/0102591 A1 | 6/2003 | Thielman |
| 2003/0108710 A1 | 6/2003 | Coyle |
| 2003/0129385 A1 | 7/2003 | Hojo |
| 2004/0027675 A1 | 2/2004 | Wu |
| 2004/0075897 A1 | 4/2004 | Ookawa |
| 2004/0094262 A1 | 5/2004 | Canti |
| 2004/0156130 A1 | 8/2004 | Powell |
| 2005/0008821 A1 | 1/2005 | Pricone |
| 2005/0051931 A1 | 3/2005 | Humlicek |
| 2005/0052750 A1 | 3/2005 | King |
| 2005/0207031 A1 | 9/2005 | Eckhardt |
| 2005/0224997 A1 | 10/2005 | Liao |
| 2005/0231809 A1 | 10/2005 | Carlson |
| 2005/0276071 A1 | 12/2005 | Sasagawa |
| 2006/0061869 A1 | 3/2006 | Fadel |
| 2006/0062969 A1 | 3/2006 | Honda |
| 2006/0209428 A1 | 9/2006 | Dobbs |
| 2006/0210714 A1 | 9/2006 | Huizinga |
| 2006/0210770 A1 | 9/2006 | Nelson |
| 2006/0236877 A1 | 10/2006 | Strand |
| 2006/0251803 A1 | 11/2006 | Huizinga |
| 2007/0141249 A1 | 6/2007 | Humlicek |
| 2007/0151468 A1 | 7/2007 | Strand |
| 2008/0131667 A1 | 6/2008 | King |
| 2010/0285231 A1 | 11/2010 | Huizinga |

FOREIGN PATENT DOCUMENTS

| | | |
|---|---|---|
| DE | 3206164 | 9/1982 |
| EP | 0405898 | 1/1991 |
| EP | 0623440 | 11/1994 |
| EP | 0814300 | 12/1997 |
| EP | 0896259 | 2/1999 |
| EP | 0961138 | 12/1999 |

(56) References Cited

FOREIGN PATENT DOCUMENTS

| | | |
|---|---|---|
| EP | 13527322 | 10/2003 |
| EP | 1473594 | 11/2004 |
| JP | 53051253 | 5/1978 |
| JP | 04-153686 | 5/1992 |
| JP | 04-299329 | 10/1992 |
| JP | 07-148856 | 6/1995 |
| JP | 07-175131 | 7/1995 |
| JP | 2000-183253 | 6/2000 |
| JP | 2002-113728 | 4/2002 |
| JP | 2002-287256 | 10/2002 |
| JP | 2005-007873 | 1/2005 |
| JP | 2005-053004 | 3/2005 |
| WO | WO 93/23244 | 11/1993 |
| WO | WO 94/01288 | 1/1994 |
| WO | WO 98/52733 | 11/1998 |
| WO | WO 99/00700 | 1/1999 |
| WO | WO 00/17710 | 3/2000 |
| WO | WO 01/27527 | 4/2001 |
| WO | WO 02/04858 | 1/2002 |
| WO | WO 2004/027492 | 4/2004 |
| WO | WO 2004/099823 | 11/2004 |
| WO | WO 2005/025837 | 3/2005 |
| WO | WO 2005/025845 | 3/2005 |

OTHER PUBLICATIONS

Sasagawa, "P-51: Dual Directional Backlight for Stereoscopic LCD," *SID 03 Digest*, pp. 399-401 (2003).
Dictionary Excerpt: *Webster's Ninth New Collegiate Dictionary*, Merriam/Webster Inc., pp. 992 and 1169 (1990).
International Search Report for PCT/US2006/007972, 3 pages.

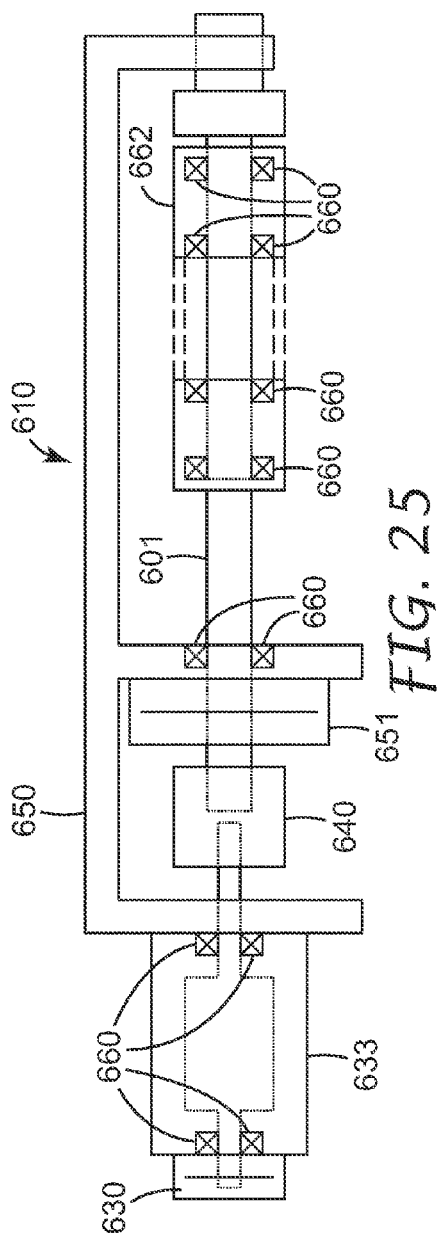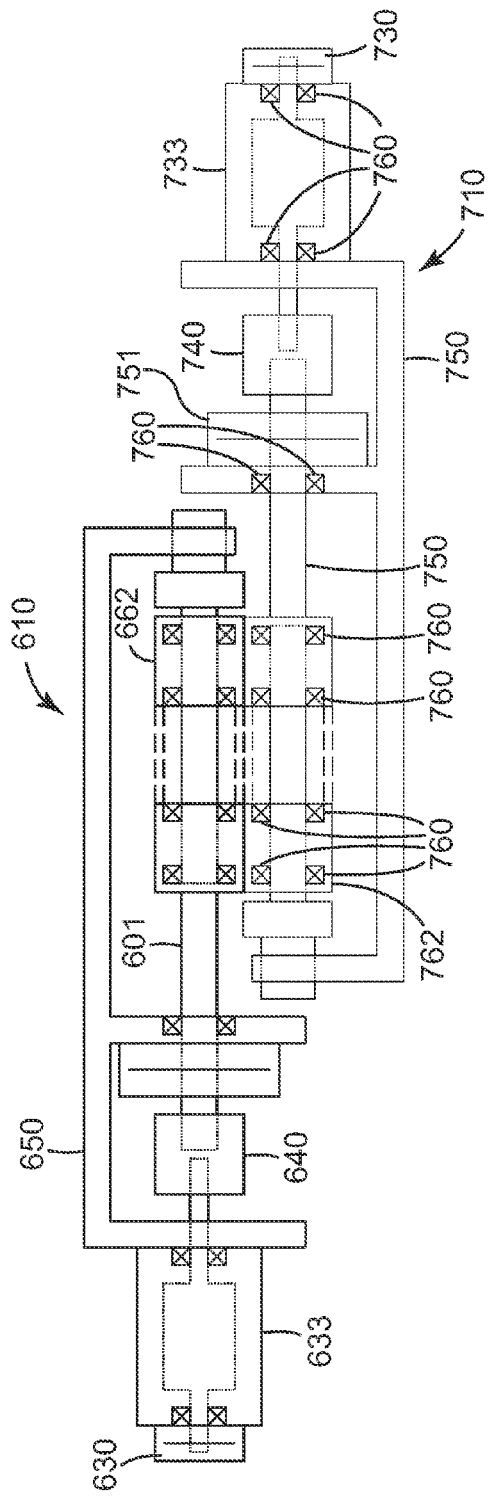

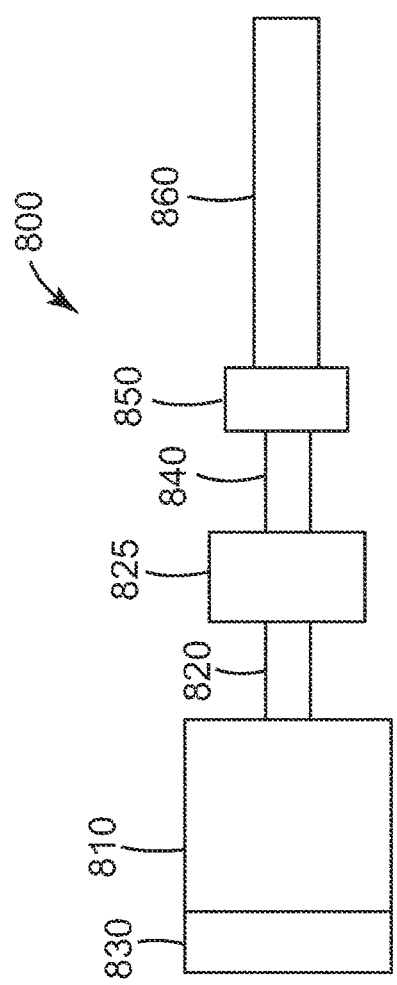

APPARATUS AND METHOD FOR PRODUCING TWO-SIDED PATTERNED WEB IN REGISTRATION

CROSS REFERENCE TO RELATED APPLICATION

This application is a divisional of U.S. application Ser. No. 12/837,826, filed Jul. 16, 2010, now allowed, which is a divisional of U.S. application Ser. No. 11/370,136, filed Mar. 6, 2006, now U.S. Pat. No. 7,767,273, which claims the benefit of U.S. Provisional Application No. 60/661,430, filed Mar. 9, 2005, the disclosure of which is incorporated by reference in their entirety herein.

TECHNICAL FIELD

The disclosure relates generally to the continuous casting of material onto a web, and more specifically to the casting of articles having a high degree of registration between the patterns cast on opposite sides of the web. In particular, the disclosure relates to casting patterns onto opposite sides of a web with a high degree of registration.

BACKGROUND

Many articles can be manufactured by applying a material that is at least temporarily in liquid form to opposite sides of a substrate. It is often the case that the material applied to the substrate is applied in a predetermined pattern. It is common in such cases for there to be at least a minimum requirement for registration between the patterns on opposite sides of the substrate. In some cases, it is necessary for the patterns on either side of a substrate to be aligned within very small tolerances.

A need remains, therefore, for improved techniques, apparatus and methods of producing two-sided substrates in which each side of the substrate bears a predetermined pattern in close registration with the predetermined pattern on the other side of the substrate. A need remains for improved techniques, apparatus and methods of reproducing closely registered microreplicated patterns on either side of a flexible, at least partially opaque web or substrate.

SUMMARY

The disclosure pertains generally to improved techniques, apparatus and methods of reproducing closely registered microreplicated patterns on either side of a flexible web or substrate.

Accordingly, an illustrative embodiment of the disclosure may be found in an assembly that includes an energy source adapted to provide curing energy. The assembly includes a first patterned roll having a number of regions that are opaque to the curing energy disposed on a substrate that is transparent to the curing energy. The opaque regions define a first pattern. The assembly includes a second patterned roll that define a second pattern. The second patterned roll can have a number of regions that are opaque to the curing energy disposed on a substrate that is transparent to the curing energy, where the opaque regions define a second pattern.

The assembly also includes means for rotating the first and second patterned rolls such that the first and second patterns are maintained in continuous registration to within 100 micrometers. In some instances, the first and second patterns are maintained in continuous registration to within 10 micrometers.

In some instances, the opaque regions block, scatter, absorb or reflect at least 98 percent of the curing energy incident upon the opaque regions. In some cases, the transparent substrates permit at least 25 percent of the curing energy incident upon the transparent substrates to pass through. In some cases, the substrates define an outer substrate surface, and the opaque regions extend radially outwardly from the outer substrate surface. In some instances, the opaque regions are located at a periphery of the substrate, and the transparent regions of the substrate extend inwardly from the periphery.

Another illustrative embodiment of the disclosure may be found in an apparatus that includes an energy source that is adapted to provide curing energy, a first patterned roll and a second patterned roll. The energy source may be adapted to provide ultraviolet light. The first patterned roll includes a number of regions that are opaque to the curing energy disposed on a substrate that is transparent to the curing energy. The opaque regions define a first raised pattern. The second patterned roll includes a number of regions that are opaque to the curing energy disposed on a substrate that is transparent to the curing energy. The opaque regions define a second raised pattern.

The apparatus also includes one or more feed rolls that are adapted to provide a web and to feed the web into contact with the first and second patterned rolls. In some embodiments, the web has first and second sides and can be opaque to the curing energy. A first dispenser is adapted to dispose a curable material onto the first side of the web or the first patterned roll before the web contacts the first patterned roll and a second dispenser is adapted to dispose a curable material onto the second side of the web or the second patterned roll before the web contacts the second patterned roll.

The apparatus also includes means for rotating the first and second patterned rolls such that the first and second raised patterns are imprinted in the curable material on the first and second sides of the web while the web is in continuous motion, and the first and second raised patterns are maintained in continuous registration on the first and second sides of the web to within 100 micrometers. In some instances, the first and second raised patterns are maintained in continuous registration to within 10 micrometers.

In some instances, the opaque regions block, scatter, absorb or reflect at least 98 percent of the curing energy incident upon the opaque regions. In some cases, the transparent substrates permit at least 10 percent of the curing energy incident upon the transparent substrates to pass through. In some instances, the web permits less than 2 percent of curing energy incident on the web to pass through the web.

In some instances, the transparent substrates may include a glass cylinder and may in particular cases include a quartz cylinder. The transparent substrates may be a polymeric cylinder such as a PMMA (poly methyl methacrylate) cylinder. The opaque regions may include materials such as chrome, copper, aluminum or epoxy.

The energy source may, in some instances, be adapted to provide curing energy that passes at least partially through the first patterned roll and/or at least partially through the second patterned roll. The energy source may include a first curing energy source disposed within the first patterned roll and a second curing energy source disposed within the second patterned roll.

Another illustrative embodiment of the disclosure may be found in a method of patterning an opaque web that has a first side and a second side. Curable material is disposed onto the opaque web, which is then directed into contact with a first patterned roll having a number of raised opaque regions disposed on a transparent substrate. Ultraviolet radiation is directed at least partially through the first patterned roll, thereby curing the curable material on the first side of the opaque web to form a first pattern. The opaque web is then directed into contact with a second patterned roll having a number of opaque regions disposed on a transparent substrate. Ultraviolet radiation is directed at least partially through the second patterned roll, thereby curing the curable material on the second side of the opaque web to form a second pattern. The first and second sides of the web are patterned while the web is in continuous motion such that the first and second patterns are maintained in continuous registration to within 100 micrometers. In some instances, the first and second patterns are maintained to within 10 micrometers.

In some instances, disposing curable material onto the opaque web includes disposing curable material onto the first side of the web or first patterned roll prior to the first side of the web contacting the first patterned roll and disposing curable material onto the second side of the web or second patterned roll prior to the second side of the web contacting the second patterned roll.

Another illustrative embodiment of the disclosure may be found in a patterned roll that includes a curing energy transparent cylinder, a tie layer disposed on the curing energy transparent cylinder, and a number of curing energy opaque features disposed on the tie layer to form a pattern. The curing energy transparent cylinder permits at least 10 percent of curing energy light incident upon the cylinder to pass through the cylinder while the curing energy opaque features block at least 98 percent of curing energy light incident upon the curing energy opaque features. In some particular instances, the curing energy transparent cylinder includes quartz, the tie layer includes titanium, and the curing energy opaque feature includes chrome.

The above summary of the present disclosure is not intended to describe each disclosed embodiment or every implementation of the present disclosure. The Figures, Detailed Description and Examples which follow more particularly exemplify these embodiments.

DEFINITIONS

In the context of this disclosure, "registration," means the positioning of structures on one surface of the web in a defined relationship to other structures on the opposite side of the same web.

In the context of this disclosure, "web" means a sheet of material having a fixed dimension in a first direction and either a predetermined or indeterminate length in a second direction that is orthogonal to the first direction.

In the context of this disclosure, "continuous registration," means that at all times during rotation of first and second patterned rolls the degree of registration between structures on the rolls is better than a specified limit.

In the context of this disclosure, "microreplicated" or "microreplication" means the production of a microstructured surface through a process where the structured surface features retain an individual feature fidelity during manufacture, from product-to-product, that varies no more than about 100 micrometers.

In the context of this disclosure, "curing energy" refers to electromagnetic radiation having a particular wavelength or band of wavelengths suitable for curing a curable material. The phrase "curing energy" may be modified by a term identifying the wavelength or band of wavelengths. For example, "ultraviolet curing energy" refers to energy within a band of wavelengths that is considered to be ultraviolet and that is suitable for curing a particular material. The phrase "curable material", when used in conjunction with "curing energy", refers to a material that may be cured, polymerized or cross-linked when exposed to "curing energy".

In the context of this disclosure, "opaque" refers to a material that blocks at least a significant amount of electromagnetic radiation of a particular wavelength or band of wavelengths. A material may be considered to be opaque to energy of a first wavelength, but not be opaque to energy of a second wavelength. A material that is "opaque" to energy of a particular wavelength may block at least 95 percent of the energy of that particular wavelength that is incident upon the material. An "opaque" material may block 98 percent or even more than 99 percent of the energy of that particular wavelength that is incident upon the material.

A material may be described as "opaque to curing energy", meaning that the material blocks at least 95 percent of the curing energy (of a particular wavelength or band of wavelengths) incident upon the material. A material described as "opaque to ultraviolet energy" would block at least 95 percent of ultraviolet radiation incident upon the material.

A material such as a flexible web or substrate may be described as "opaque", meaning that the flexible web or substrate blocks at least 95 percent of the electromagnetic energy of a particular wavelength or band of wavelengths incident upon the flexible web or substrate. A flexible web or substrate may be described as described as "opaque to curing energy", meaning that the flexible web or substrate blocks at least 95 percent of the curing energy (of a particular wavelength or band of wavelengths) incident upon the flexible web or substrate. A flexible web or substrate described as "opaque to ultraviolet energy" would block at least 95 percent of ultraviolet radiation incident upon the flexible web or substrate.

As used within the context of this disclosure, "transparent" refers to a material that transmits, or permits passage, of at least a significant amount of electromagnetic radiation of a particular wavelength or band of wavelengths. A material may be considered to be transparent to energy of a first wavelength, but not be transparent to energy of a second wavelength. A material that is "transparent" to energy of a particular wavelength may transmit or permit passage at least 10 percent of the energy of that particular wavelength that is incident upon the material. A "transparent" material may transmit or permit passage of 25 percent or even more than 50 percent of the energy of that particular wavelength that is incident upon the material.

A material may be described as "transparent to curing energy", meaning that the material transmits or permits passage of at least 10 percent of the curing energy (of a particular wavelength or band of wavelengths) incident upon the material. A material described as "transparent to ultraviolet energy" would transmit or permit passage of at least 10 percent of ultraviolet radiation incident upon the material.

BRIEF DESCRIPTION OF THE FIGURES

The disclosure may be more completely understood in consideration of the following detailed description of various embodiments of the disclosure in connection with the accompanying drawings, in which:

FIG. 25 is a schematic illustration of a roll mounting arrangement in accordance with an embodiment of the disclosure;

FIG. 26 is a schematic illustration of a mounting arrangement for a pair of patterned roll in accordance with an embodiment of the disclosure;

FIG. 27 is a schematic illustration of a motor and roll arrangement in accordance with an embodiment of the disclosure;

Figure 1:
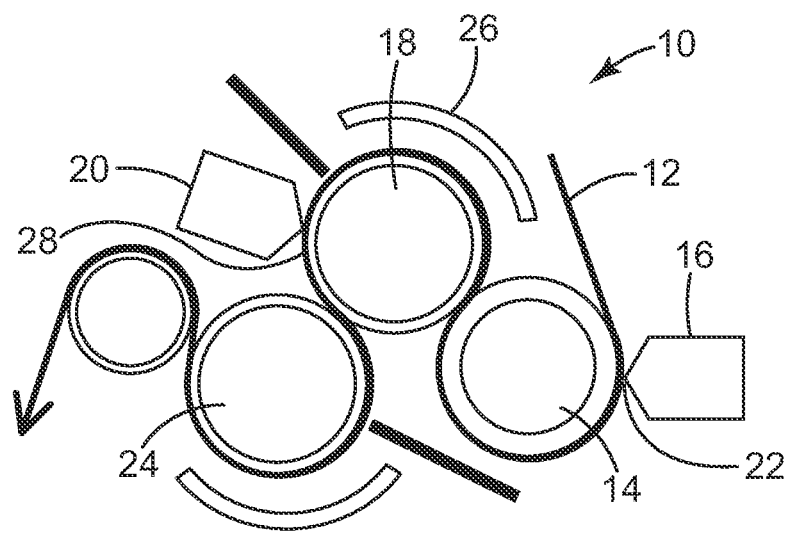
FIG. 1 is a schematic illustration of a casting apparatus in accordance with an embodiment of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Generally, the present disclosure pertains to producing two-sided microreplicated structures having a first microreplicated pattern on a first surface of a web and a second microreplicated pattern on a second surface of the web. The system generally includes a first patterning assembly and a second patterning assembly. Each respective assembly creates a microreplicated pattern on either a first or second surface of the web. A first pattern can be created on the first surface of the web and a second pattern can be created on the second surface of the web.

In some instances, the apparatus and methods discussed herein result in a web having a microreplicated structure on each opposing surface of the web that can be manufactured by continuously forming microreplicated structures on opposite surfaces of the web while keeping the microreplicated structures registered generally to within 100 micrometers of each other. In some instances, the microreplicated structures may remain registered within 50 micrometers. In some cases, the microreplicated structures may remain registered within 20 micrometers. In some instances, the microreplicated structures may remain registered within 10 micrometers or even within 5 micrometers.

The following description should be read with reference to the drawings, in which like elements in different drawings are numbered in like fashion. The drawings, which are not necessarily to scale, depict selected embodiments and are not intended to limit the scope of the disclosure. Although examples of construction, dimensions, and materials are illustrated for the various elements, those skilled in the art will recognize that many of the examples provided have suitable alternatives that may be utilized.

Casting Assembly

FIG. 1 illustrates an example casting apparatus 10 for producing a two-sided web 12 that includes registered microreplicated structures on opposing surfaces. In some instances, the casting apparatus 10 includes first and second coating means 16, 20, a nip roller 14, and first and second patterned rolls 18, 24. In some instances, first coating means 16 may be a first extrusion die 16 while second coating means may be a second extrusion die 20. In the illustrated embodiment, the first and second curable liquid is disposed on the web surface prior to passing through the first and second patterned rolls, respectively. In other embodiments, the first curable liquid is disposed on the first patterned roll and the second curable liquid is disposed on the second patterned roll, which is then transferred to the web from the patterned rolls.

Web 12 may be presented to the first extrusion die 16, which dispenses a first curable liquid layer coating 22 onto the web 12. Nip roller 14 presses first coating 22 into the first patterned roller 18. In some cases, nip roller 14 can be a rubber covered roller. While on the first patterned roll 18, the coating 22 is cured using an energy source 26 adapted to provide suitable curing energy. In some instances, energy source 26 may be adapted to provide ultraviolet light. The term "ultraviolet light" refers to light having a wavelength in a range from 200 to 500 nanometers or from 200 to 400 nanometers.

A second curable liquid layer 28 is coated on the opposite side of the web 12 using a second side extrusion die 20. The second layer 28 is pressed into the second patterned tool roller 24 and the curing process repeated for the second coating layer 28. Registration of the two coating patterns is achieved by maintaining the tool rollers 18, 24 in a precise angular relationship with one another, as will be described hereinafter.

Figure 2:
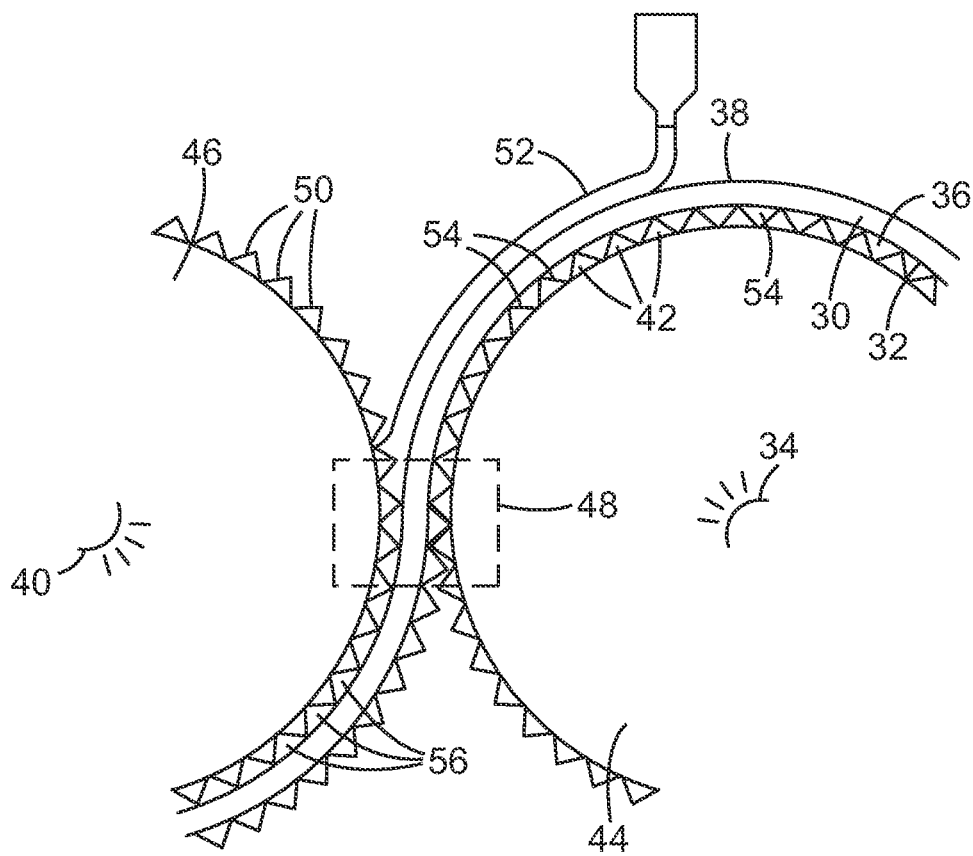
FIG. 2 is a schematic illustration of a portion of the casting apparatus shown in FIG. 1.

FIG. 2 provides a closer view at first and second patterned rolls 44 and 46. First and second patterned rolls 44, 46 may be considered as particular embodiments of patterned rolls 18, 24 as discussed with respect to FIG. 1. Other patterns are contemplated, as will be discussed in greater detail subsequently. First patterned roll 44 has a first pattern 42 for forming a microreplicated surface. Second pattern roll 46 has a second microreplicated pattern 50. In the illustrated embodiment, first and second patterns 42, 50 are the same pattern. In other instances, the first and second patterns may be different.

As a web 30 passes over the first patterned roll 44, a first curable liquid (not shown) on a first surface 32 may be cured by curing energy provided by an energy source 34 near a first region 36 on the first patterned roll 44. A first microreplicated patterned structure 54 is formed on the first side 43 of the web 30 after the liquid is cured. The first patterned structure 54 is a negative of the pattern 42 on the first patterned roll 44. After the first patterned structure 54 is formed, a second curable liquid 52 is dispensed onto a second surface 38 of the web 30. To insure that the second liquid 52 is not cured prematurely, the second liquid 52 is isolated from the first energy source 34, typically by locating the first energy source 34 so that energy emitted by the first energy source 34 does not fall on the second liquid 52. If desired, the curing sources can be located inside their respective patterned rolls. As such, the opaque nature of web 30 can aid in preventing undesired curing.

After the first patterned structure 54 is formed, the web 30 continues along the first roll 44 until it enters a gap region 48 between the first and second patterned rolls 44, 46. The second liquid 52 then engages the second pattern 50 on the second patterned roll 46 and is shaped into a second microreplicated structure, which is then cured by curing energy emitted by a second energy source 40. As the web 30 passes into the gap 48 between first and second patterned rolls 44, 46, the first patterned structured 54, which is by this time substantially cured and bonded to the web 30, restrains the web 30 from slipping while the web 30 begins moving into the gap 48 and around the second patterned roller 46. This removes web stretching and slippages as a source of registration error between the first and second patterned structures formed on the web.

By supporting the web 30 on the first patterned roll 44 while the second liquid 52 comes into contact with the second patterned roll 46, the degree of registration between the first and second microreplicated structures 54, 56 formed on opposite sides 32, 38 of the web 30 becomes a function of controlling the positional relationship between the surfaces of the first and second patterned rolls 44, 46. The S-wrap of the web around the first and second patterned rolls 44, 46 and between the gap 48 formed by the rolls minimizes effects of tension, web strain changes, temperature, microslip caused by mechanics of nipping a web, and lateral position control. The S-wrap can maintain the web 30 in contact with each roll over a wrap angle of 180 degrees, though the wrap angle can be more or less depending on the particular requirements.

Patterned Roll

In some instances, it may be useful to provide microreplicated patterns onto either side of a flexible web or substrate that is opaque, particularly, opaque to curing energy. In other instances, it may be useful to provide microreplicated patterns onto either side of a flexible web or substrate that is transparent, particularly, transparent to curing energy. When the web or substrate is opaque to the curing energy necessary to cure the materials applied to the web in liquid form, the materials cannot simply be cured by passing curing energy through the web or substrate to contact the liquid resin. In these cases, it may be useful to use a patterned roll that is transparent to a particular curing energy or includes portions that are transparent to curing energy. In some cases, only one patterned roll is transparent.

Figure 3:
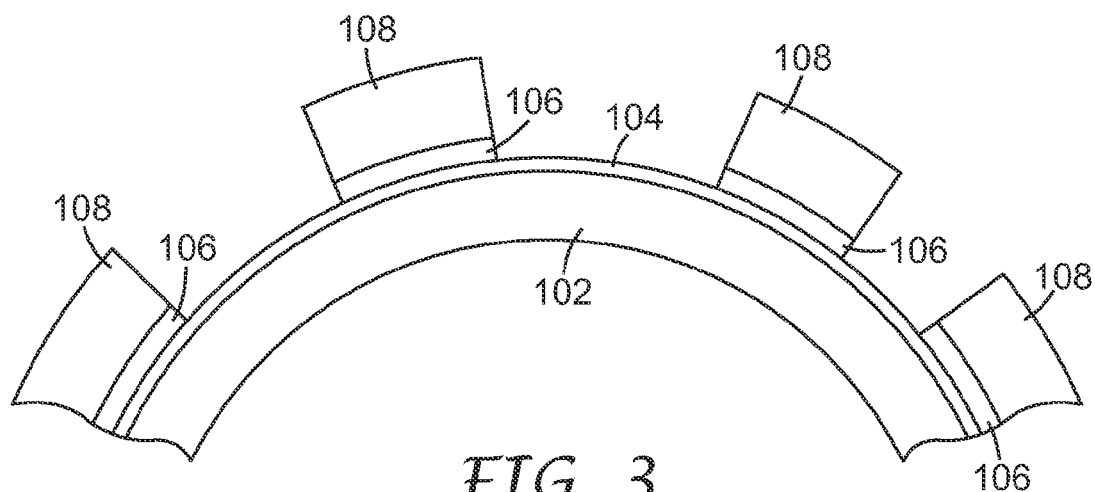
FIG. 3 is a partial illustration of a patterned roll in accordance with an embodiment of the disclosure.

FIG. 3 is a partial illustration of an illustrative but non-limiting patterned roll and should not be considered as being to scale. Instead, the pattern has been exaggerated for clarity. Patterned roll can, as illustrated and as will be discussed in greater detail, may be formed by an additive method in which materials are deposited onto the surface of a transparent cylinder or other suitable shape. In some embodiments, it is believed that patterned roll may be formed using various subtractive methods in which material is removed from a transparent cylinder or other suitable shape.

Patterned roll includes a transparent cylinder 102 that can be formed of any suitable material. In some instances, transparent cylinder 102 is formed of a material that is transparent to the curing energy that will cure the curable material that will be applied to patterned roll. In some instances, as illustrated, transparent cylinder 102 can be made from a glass such as quartz.

As illustrated, in particular, patterned roll includes a quartz cylinder 102. Quartz cylinder 102 may be of any suitable dimensions, although in some cases quartz cylinder 102 may have a length of 3 inches and a radius of 3 inches. Quartz cylinder 102 may be a substantially solid cylinder, or, as illustrated, quartz cylinder 102 may be a hollow cylinder.

In some cases, it may be useful to apply a thin tie layer 104 to the surface of the quartz cylinder 102. This may assist subsequent materials in adhering or bonding to the quartz. In some instances, tie layer 104 is thin enough to not materially change the optical properties of the quartz cylinder 102. At a minimum, tie layer 104 can be thin enough to remain transparent to curing energy. Tie layer 104 may be formed of any suitable material and using any suitable application technique. In some instances, tie layer 104 includes or consists of titanium and is applied via sputtering.

Once tie layer 104 has been formed, subsequent materials may be added to patterned roll. While particular processing steps are illustrated in FIGS. 4-13, and will be discussed in detail with respect to the Example, a variety of opaque materials may be applied to tie layer 104. Suitable opaque materials include metals such as chrome, copper or aluminum, and curable polymers such as silicone and epoxy. Suitable materials may be applied and patterned using any suitable technique, such as sputtering, etching, and the like.

In the illustrated embodiment, the features of patterned roll have been formed in two steps. First, layers 106 have been deposited onto tie layer 104 and subsequently patterned. Layers 108 have been formed and patterned on top of layers 106. Layers 106 and layers 108 may be formed of different materials or they may be formed of the same material. In some instances, layers 106 may be formed by sputtering a layer of chrome onto tie layer 104. In some instances, layers 108 may be formed by plating chrome onto layers 106.

In FIG. 3, the opaque features of patterned roll stand above the surface of quartz cylinder 102. In some contemplated embodiments, such as those discussed with respect to FIGS. 14-21, the opaque features are actually closer to an outer surface of the substrate, while the transparent features actually penetrate the substrate. In either event, the opaque features may be considered as being farther from a radial center of patterned roll than are the transparent features.

In some instances, a patterned roll may be formed from either machinable or non-machinable transparent substrates. Several contemplated manufacturing techniques are described herein in FIGS. 14-21. It should be noted that in FIGS. 14-21, only a very small part of a transparent substrate is shown, for ease of illustration. While only a single transparent feature is shown for each potential manufacturing technique, it should be noted that of course a patterned roll will include a number of features. Moreover, it should be noted that a patterned roll will be cylindrical, while for ease of illustration and because only a very small part of the roll is shown, FIGS. 14-21 appear rectangular.

Figure 14A:
FIGS. 14A-14E demonstrate an illustrative but non-limiting method of forming a patterned roll in accordance with an embodiment of the disclosure.
Figure 14B:
Figure 14C:
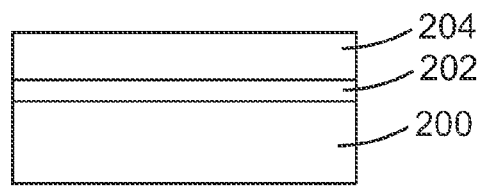
Figure 14D:
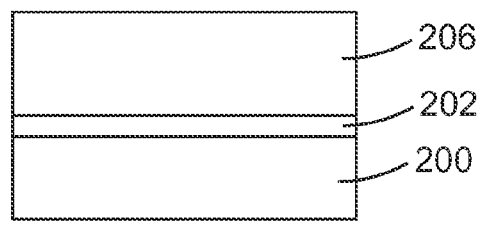

FIGS. 14A-14E illustrate a potential method of forming opaque features on a non-machinable transparent substrate that includes adding a machinable layer. In FIG. 14A, a non-machinable, transparent, substrate 200 is provided. Examples of non-machinable, transparent substrates include glasses such as quartz. As shown in FIG. 14B, a titanium tie layer 202 may be applied to substrate 200 using any suitable technique such as sputtering. A copper seed layer 204 may be sputtered onto titanium tie layer 202 as seen in FIG. 14C. Additional copper may be plated onto copper seed layer 204 to form copper layer 206, as seen in FIG. 14D.

Figure 14E:
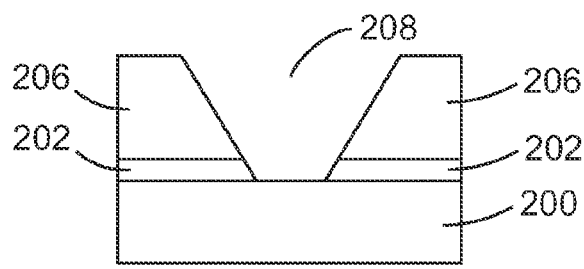

FIG. 14E shows that copper layer 206 could be machined in any suitable manner to provide a transparent feature 208 positioned within copper layer 206, which is of course opaque. In some instances, transparent feature 208 could be formed simply by a machining process such as micromilling, laser ablation, diamond turning or EDM processing. In some cases, additional processing such as a brief chemical etch may be useful in exposing transparent substrate 200 without damaging transparent substrate 200.

In some instances, other materials may be used for the machinable layer 206. For example, machinable layer 206 could be formed from an opaque epoxy or a machinable ceramic that could be coated in a "green" state and sintered after shaping.

Figure 15A:
FIGS. 15A-15D demonstrate an illustrative but non-limiting method of forming a patterned roll in accordance with an embodiment of the disclosure.
Figure 15B:
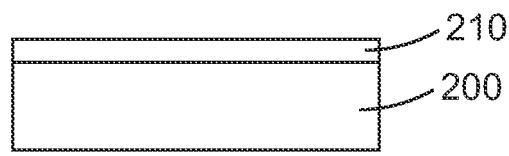
Figure 15C:
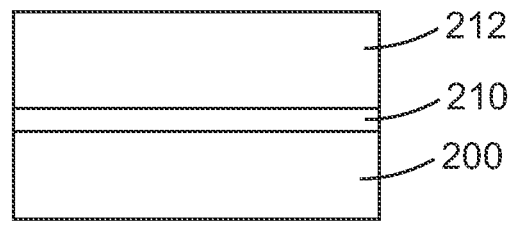
Figure 15D:
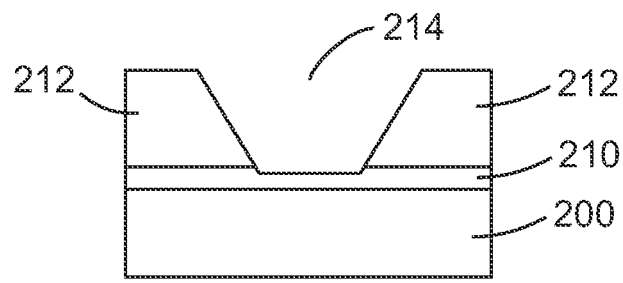

FIGS. 15A-15D illustrate another potential method of forming opaque features on a non-machinable transparent substrate 200 that includes adding a machinable layer. In FIG. 15B, a transparent epoxy layer 210 may be added to the transparent substrate 200 to help protect the transparent substrate during subsequent machining. As seen in FIG. 15C, an opaque epoxy layer 212 has been added on top of the transparent epoxy layer 210. In FIG. 15D, opaque epoxy layer 212 has been machined using any suitable technique to form transparent feature 214.

Figure 16A:
FIGS. 16A-16D demonstrate an illustrative but non-limiting method of forming a patterned roll in accordance with an embodiment of the disclosure.
Figure 16B:
Figure 16C:
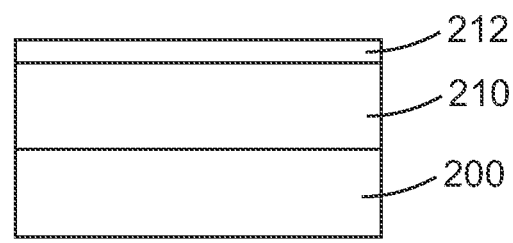
Figure 16D:
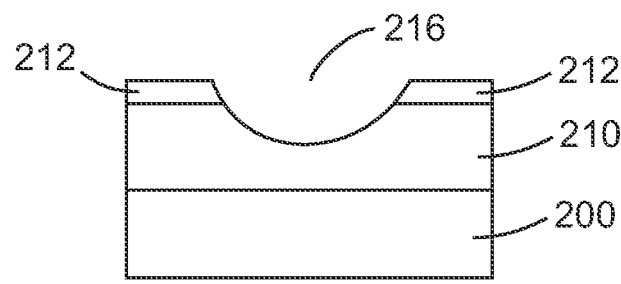

FIGS. 16A-D illustrate another potential method of forming opaque features on a non-machinable transparent substrate 200 that includes adding a machinable layer. Transparent substrate 200 is shown in FIG. 16A. In FIG. 16B, a relatively thicker transparent epoxy layer 210 has been added atop transparent substrate 200. A relatively thinner opaque epoxy layer 212 has been added on transparent epoxy layer 210 as shown in FIG. 16C. In FIG. 16D, the opaque epoxy layer 212 and the transparent epoxy layer 210 have been machined using any suitable technique to form transparent feature 216. As an alternate, it may be feasible to machine transparent feature 216 into a transparent epoxy layer, then coat the tops of the transparent epoxy layer with an opaque epoxy layer.

Figure 17A:
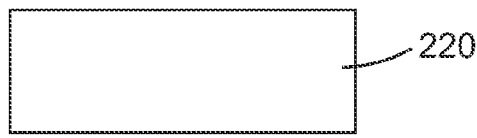
FIGS. 17A-17C demonstrate an illustrative but non-limiting method of forming a patterned roll in accordance with an embodiment of the disclosure.
Figure 17B:
Figure 17C:
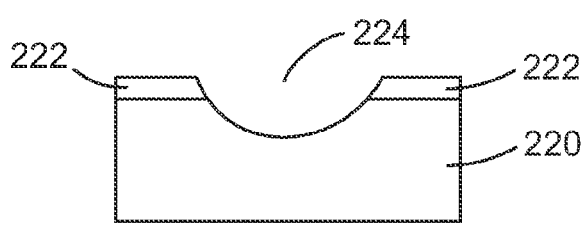

FIGS. 17A-17C illustrate a potential method of forming opaque features on a machinable transparent substrate. FIG. 17A shows a machinable transparent substrate 220 that can be formed of a machinable transparent polymer. In some instances, substrate 220 can be formed from PMMA (poly methyl methacrylate). In FIG. 17B, an opaque coating 222 such as sputtered aluminum or copper has been added onto transparent substrate 220. Alternatively, it is contemplated that opaque coating 222 could also be formed from an opaque epoxy or even an opaque filled epoxy. As shown in FIG. 17C, a transparent feature 224 can be formed using any suitable machining technique.

Figure 18A:
FIGS. 18A-18C demonstrate an illustrative but non-limiting method of forming a patterned roll in accordance with an embodiment of the disclosure.
Figure 18B:
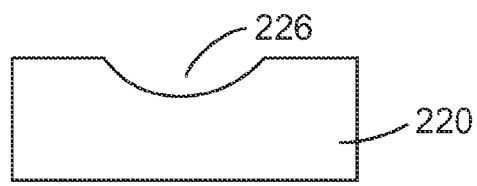
Figure 18C:
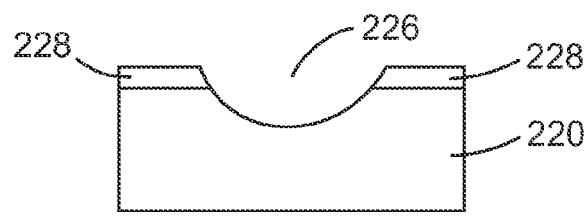

FIGS. 18A-C illustrate another potential method of forming opaque features on machinable transparent substrate 220. In FIG. 18B, transparent substrate 220 has been machined using any suitable technique to form transparent feature 226. Subsequently, as shown in FIG. 18C, the portions of transparent substrate 220 beyond transparent feature 226 may be coated with an opaque coating 228.

Figure 19A:
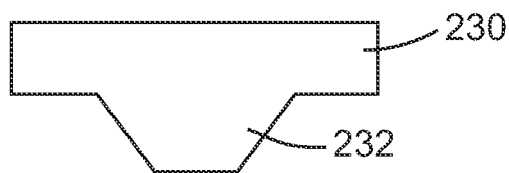
FIGS. 19A-19D demonstrate an illustrative but non-limiting method of forming a patterned roll in accordance with an embodiment of the disclosure.

FIGS. 19A-19D illustrate a potential method of using a separately-created master mold to replicate raised features on a transparent substrate. The raised features can then be coated to be opaque. In FIG. 19A, a master mold 230 can be cut from any suitable material using standard precision machining techniques. Master mold 230 can be seen to include protrusion 232, which will ultimately form a transparent feature.

Figure 19B:
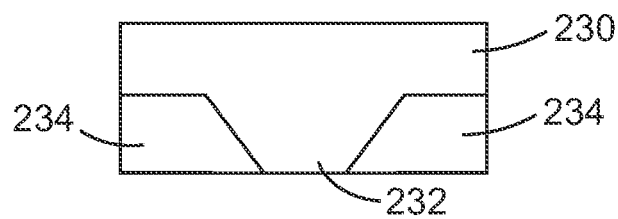
Figure 19C:
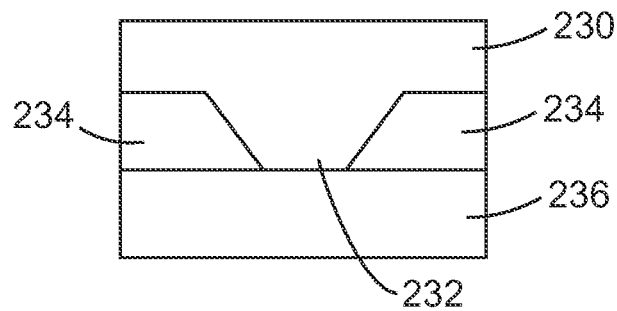
Figure 19D:
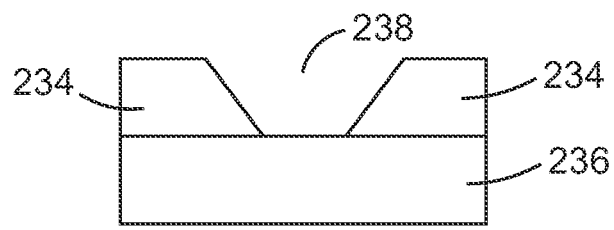

As seen in FIG. 19B, master mold 230 can be filled with an opaque epoxy material 234 and then is applied to the surface of a desired substrate 236 such as quartz or PMMA as seen in FIG. 19C. The epoxy can be allowed to cure, and then master mold 230 may be removed, as seen in FIG. 19D, leaving substrate 236 having a transparent feature 238 with an opaque layer 234 on either side of the transparent feature 238.

Figure 20A:
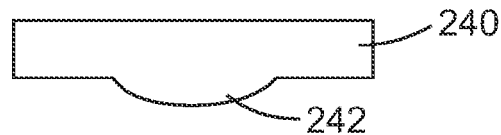
FIGS. 20A-20E demonstrate an illustrative but non-limiting method of forming a patterned roll in accordance with an embodiment of the disclosure.

FIGS. 20A-20E illustrate another potential method of using a separately-created master mold to replicate raised features on a transparent substrate. The raised features can then be coated to be opaque. In FIG. 20A, a master mold 240 can be cut from any suitable material using standard precision machining techniques. Master mold 240 can be seen to include protrusion 242, which will ultimately form a transparent feature.

Figure 20B:
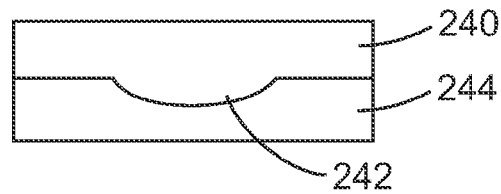
Figure 20C:
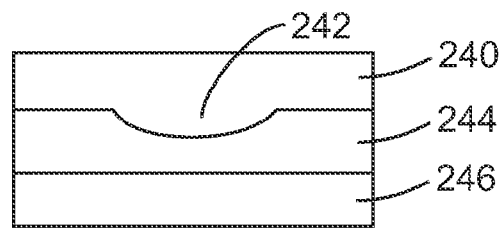
Figure 20D:
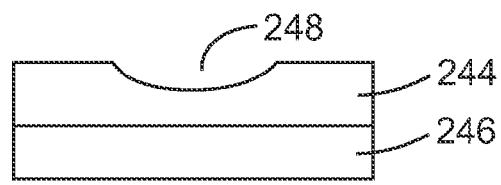
Figure 20E:
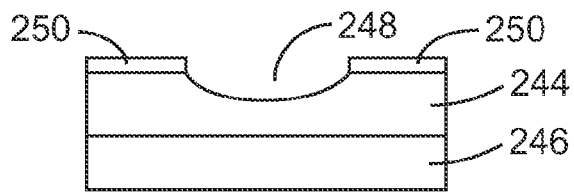

As seen in FIG. 20B, master mold 240 can be filled with a transparent epoxy material 244 and then is applied to the surface of a desired substrate 246 such as quartz or PMMA as seen in FIG. 20C. The epoxy can be allowed to cure, and then master mold 240 may be removed, as seen in FIG. 20D, leaving substrate 246 having a transparent feature 248. As seen in FIG. 20E, an opaque epoxy layer 250 can be applied to transparent epoxy layer 244 on either side of the transparent feature 248.

Figure 21A:
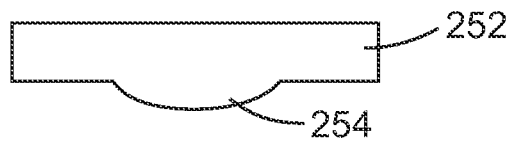
FIGS. 21A-21D demonstrate an illustrative but non-limiting method of forming a patterned roll in accordance with an embodiment of the disclosure.

FIGS. 21A-21D illustrate another potential method of using a separately-created master mold to replicate raised features on a transparent substrate. The raised features can then be coated to be opaque. In FIG. 21A, a master mold 252 can be cut from any suitable material using standard precision machining techniques. Master mold 252 can be seen to include protrusion 254, which will ultimately form a transparent feature.

Figure 21B:
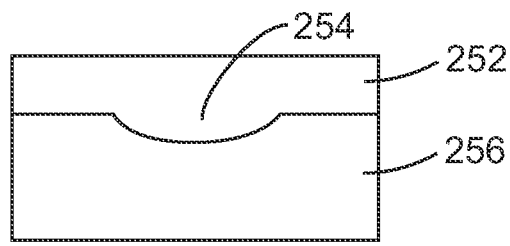
Figure 21C:
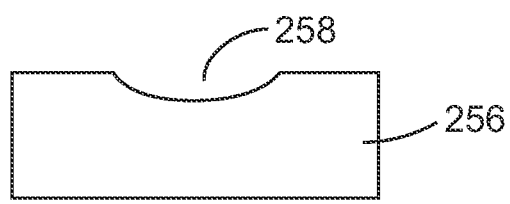
Figure 21D:
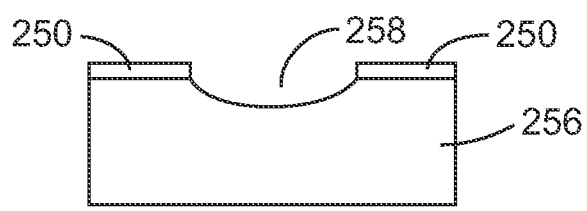

As seen in FIG. 21B, master mold 252 has been imprinted directly into a machinable transparent substrate 256. In FIG. 21C, master mold 252 has been removed, leaving transparent substrate 256 including transparent feature 258. As shown in FIG. 21D, transparent substrate 256 can be coated with an opaque epoxy layer 258 on either side of transparent feature 258.

Casting Apparatus

Figure 22:
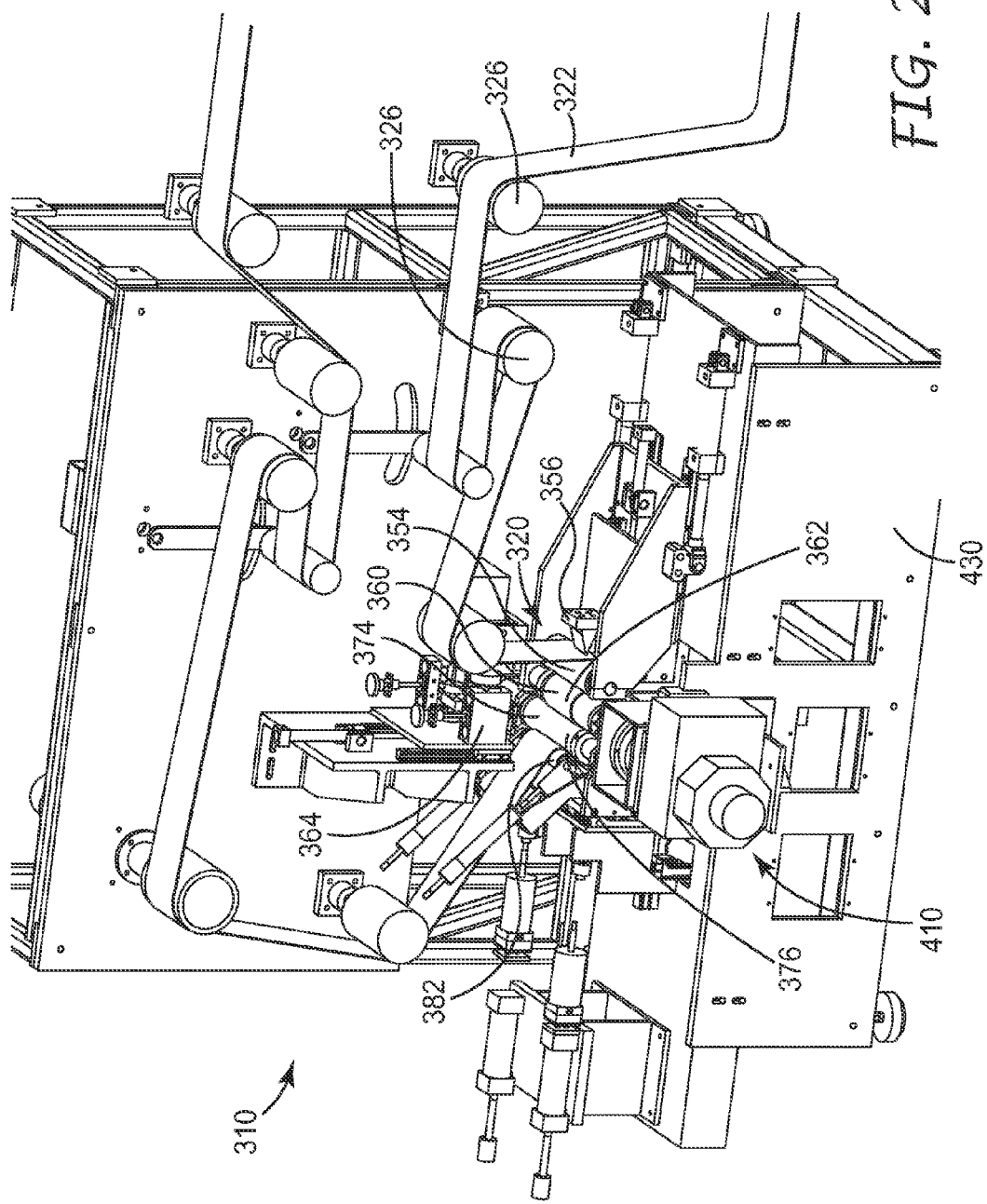
FIG. 22 is a perspective view of a microreplication assembly in accordance with an embodiment of the disclosure.
Figure 23:
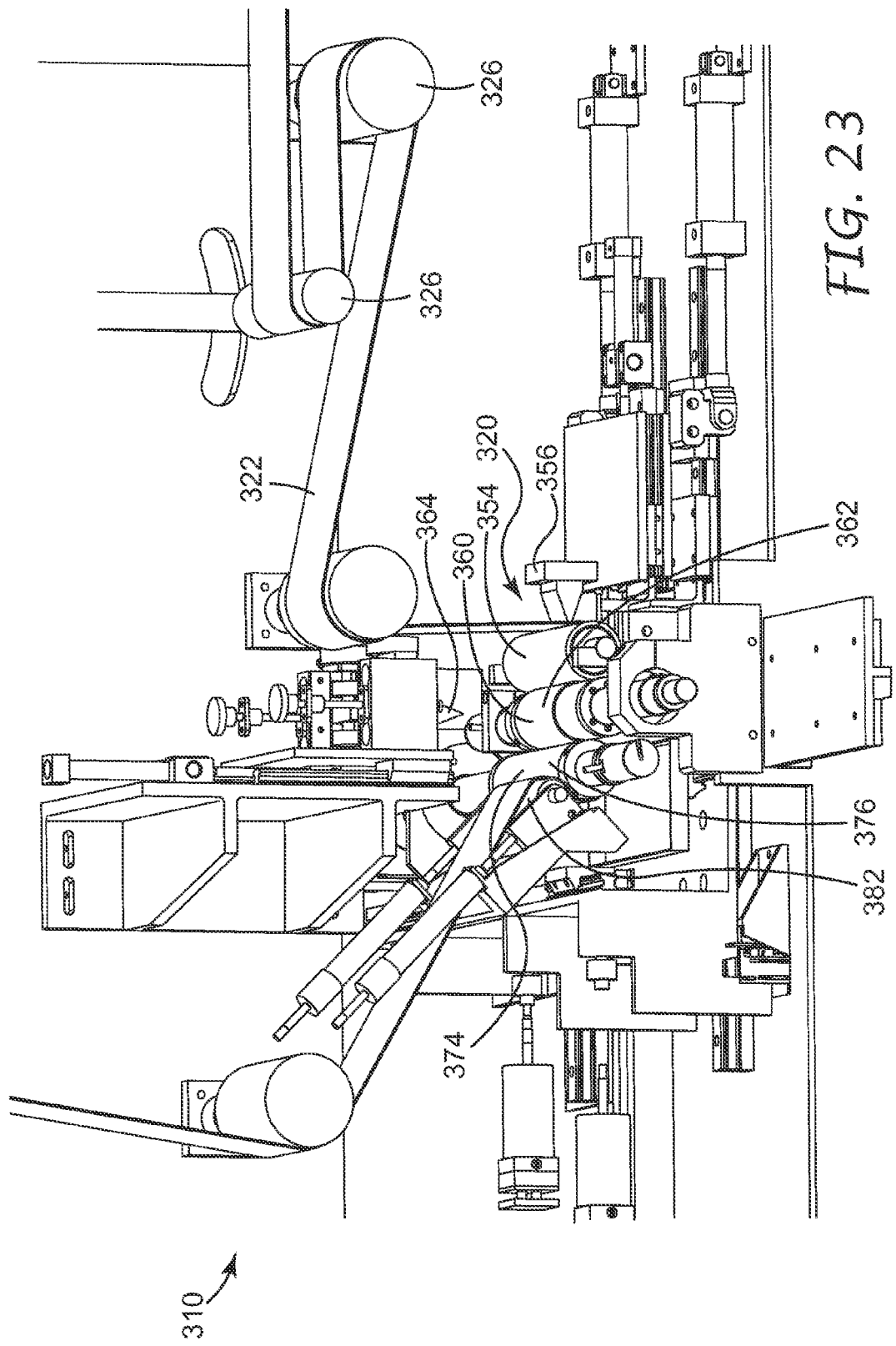
FIG. 23 is a perspective view of a portion of the microreplication assembly of FIG. 22.

Referring now to FIGS. 22-23, an example embodiment of a system 110 including a roll to roll casting apparatus 120 is illustrated. In the depicted casting apparatus 120, a web 122 is provided to the casting apparatus 120 from a main unwind spool (not shown). The exact nature of web 122 can vary widely, depending on the product being produced. However, the casting apparatus 120 is capable of handling a web 122 that is both flexible and transparent and/or opaque, as discussed previously. The web 122 is directed around various rollers 126 into the casting apparatus 120.

Accurate tension control of the web 122 is beneficial in achieving optimal results, so the web 122 may be directed over a tension-sensing device (not illustrated). If an optional liner web is used to protect the web 122, the liner web (not illustrated) can be separated at the unwind spool and directed onto a liner web wind-up spool (not shown). The web 122 can be directed via an idler roll to a dancer roller for precision tension control. Idler rollers can direct the web 122 to a position between nip roller 154 and first coating head 156.

A variety of coating methods may be employed. In some embodiments, as illustrated, first coating head 156 is a die coating head. The web 122 then passes between the nip roll 154 and first patterned roll 160. The first patterned roll 160 has a patterned surface 162, and when the web 122 passes between the nip roller 154 and the first patterned roll 160 the material dispensed onto the web 122 by the first coating head 156 is shaped into a negative of patterned surface 162.

While the web 122 is in contact with the first patterned roll 160, material is dispensed from second coating head 164 onto the other surface of web 122. In parallel with the discussion above with respect to the first coating head 156, the second coating head 164 is also a die coating arrangement including a second extruder (not shown) and a second coating die (not shown). In some embodiments, the material dispensed by the first coating head 156 is a composition including a polymer precursor and intended to be cured to solid polymer with the application of curing energy such as ultraviolet radiation.

Material that has been dispensed onto web 122 by the second coating head 164 is then brought into contact with second patterned roll 174 with a second patterned surface 176. In parallel with the discussion above, in some embodiments, the material dispensed by the second coating head 164 is a composition including a polymer precursor and intended to be cured to solid polymer with the application of curing energy such as ultraviolet radiation.

At this point, the web 122 has had a pattern applied to both sides. A peel roll 182 may be present to assist in removal of the web 122 from second patterned roll 174. In some instances, the web tension into and out of the casting apparatus is nearly constant.

The web 122 having a two-sided microreplicated pattern is then directed to a wind-up spool (not shown) via various idler rolls. If an interleave film is desired to protect web 122, it may be provided from a secondary unwind spool (not shown) and the web and interleave film are wound together on the wind-up spool at an appropriate tension.

Figure 24:
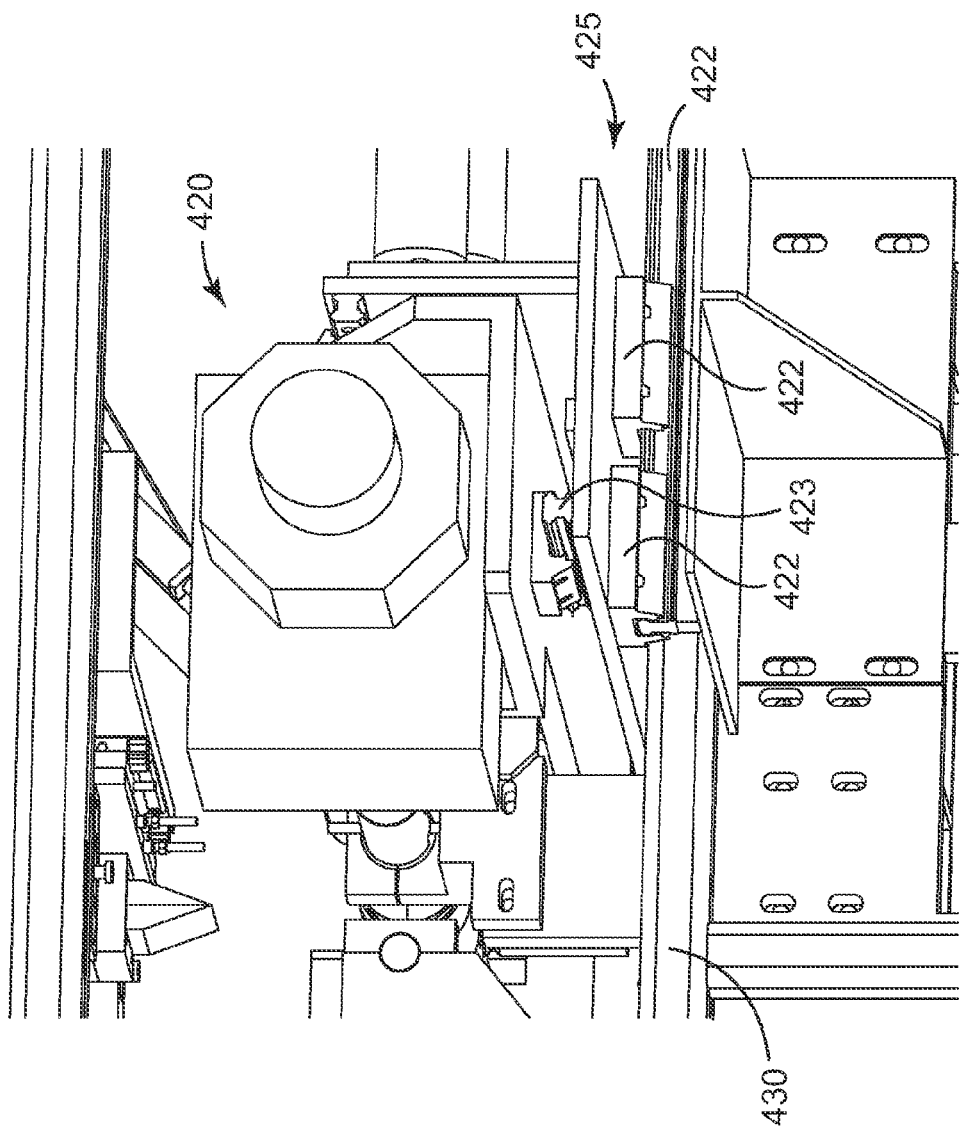
FIG. 24 is a perspective view of a portion of the microreplication assembly of FIG. 22.

Referring to FIGS. 22-24, first and second patterned rolls are coupled to first and second motor assemblies 210, 220, respectively. Support for the motor assemblies 210, 220 is accomplished by mounting assemblies to a frame 230, either directly or indirectly. The motor assemblies 210, 220 are coupled to the frame using precision mounting arrangements. In the illustrated embodiment, for example, first motor assembly 210 is fixedly mounted to frame 230. Second motor assembly 220, which is placed into position when web 122 is threaded through the casting apparatus 120, may need to be positioned repeatedly and therefore can be movable, both in the cross- and machine direction. Movable motor arrangement 220 may be coupled to linear slides 222 to assist in repeated accurate positioning, for example, when switching between patterns on the rolls. Second motor arrangement 220 also includes a second mounting arrangement 225 on the backside of the frame 230 for positioning the second patterned roll 174 side-to-side relative to the first patterned roll 160. In some cases, second mounting arrangement 225 includes linear slides 223 allowing accurate positioning in the cross machine directions.

Referring to FIG. 25, a motor mounting arrangement is illustrated. A motor 633 for driving a tool or patterned roll 662 is mounted to the machine frame 650 and connected through a coupling 640 to a rotating shaft 601 of the patterned roller 662. The motor 633 is coupled to a primary encoder 630. A secondary encoder 651 is coupled to the tool to provide precise angular registration control of the patterned roll 662.

Primary 630 and secondary 651 encoders cooperate to provide control of the patterned roll 662 to keep it in registration with a second patterned roll, as will be described further hereinafter.

Reduction or elimination of shaft resonance is important as this is a source of registration error allowing pattern position control within the specified limits. Using a coupling 640 between the motor 633 and shaft 650 that is larger than general sizing schedules specify will also reduce shaft resonance caused by more flexible couplings. Bearing assemblies 660 are located in various locations to provide rotational support for the motor arrangement.

In the example embodiment shown, the tool roller 662 diameter can be smaller than its motor 633 diameter. To accommodate this arrangement, tool rollers may be installed in pairs, arranged in mirror image. In FIG. 26, two tool roller assemblies 610, 710 are installed as mirror images in order to be able to bring the two tool rollers 662, 762 together. Referring also to FIG. 22, the first motor arrangement is typically fixedly attached to the frame and the second motor arrangement is positioned using movable optical quality linear slides.

Tool roller assembly 710 is quite similar to tool roller assembly 610, and includes a motor 733 for driving a tool or patterned roll 762 is mounted to the machine frame 750 and connected through a coupling 740 to a rotating shaft 701 of the patterned roller 762. The motor 733 is coupled to a primary encoder 730. A secondary encoder 751 is coupled to the tool to provide precise angular registration control of the patterned roll 762. Primary 730 and secondary 751 encoders cooperate to provide control of the patterned roll 762 to keep it in registration with a second patterned roll, as will be described further hereinafter.

Reduction or elimination of shaft resonance is important as this is a source of registration error allowing pattern position control within the specified limits. Using a coupling 740 between the motor 733 and shaft 750 that is larger than general sizing schedules specify will also reduce shaft resonance caused by more flexible couplings. Bearing assemblies 760 are located in various locations to provide rotational support for the motor arrangement.

Because the features sizes on the microreplicated structures on both surfaces of a web are desired to be within fine registration of one another, the patterned rolls should be controlled with a high degree of precision. Cross-web registration within the limits described herein can be accomplished by applying the techniques used in controlling machine-direction registration, as described hereinafter.

For example, to achieve about 10 micrometers end-to-end feature placement on a 10-inch circumference patterned roller, each roller must be maintained within a rotational accuracy of ±32 arc-seconds per revolution. Control of registration becomes more difficult as the speed the web travels through the system is increased.

Applicants have built and demonstrated a system having 10-inch circular patterned rolls that can create a web having patterned features on opposite surfaces of the web that are registered to within 2.5 micrometers. Upon reading this disclosure and applying the principles taught herein, one of ordinary skill in the art will appreciate how to accomplish the degree of registration for other microreplicated surfaces.

Referring to FIG. 27, a schematic of a motor arrangement 800 is illustrated. Motor arrangement 800 includes a motor 810 including a primary encoder 830 and a drive shaft 820. Drive shaft 820 is coupled to a driven shaft 840 of patterned roll 860 through a coupling 825. A secondary, or load, encoder 850 is coupled to the driven shaft 840. Using two encoders in the motor arrangement described allows the position of the patterned roll to be measured more accurately by locating the measuring device (encoder) 850 near the patterned roll 860, thus reducing or eliminating effects of torque disturbances when the motor arrangement 800 is operating.

Apparatus Control

Figure 28:
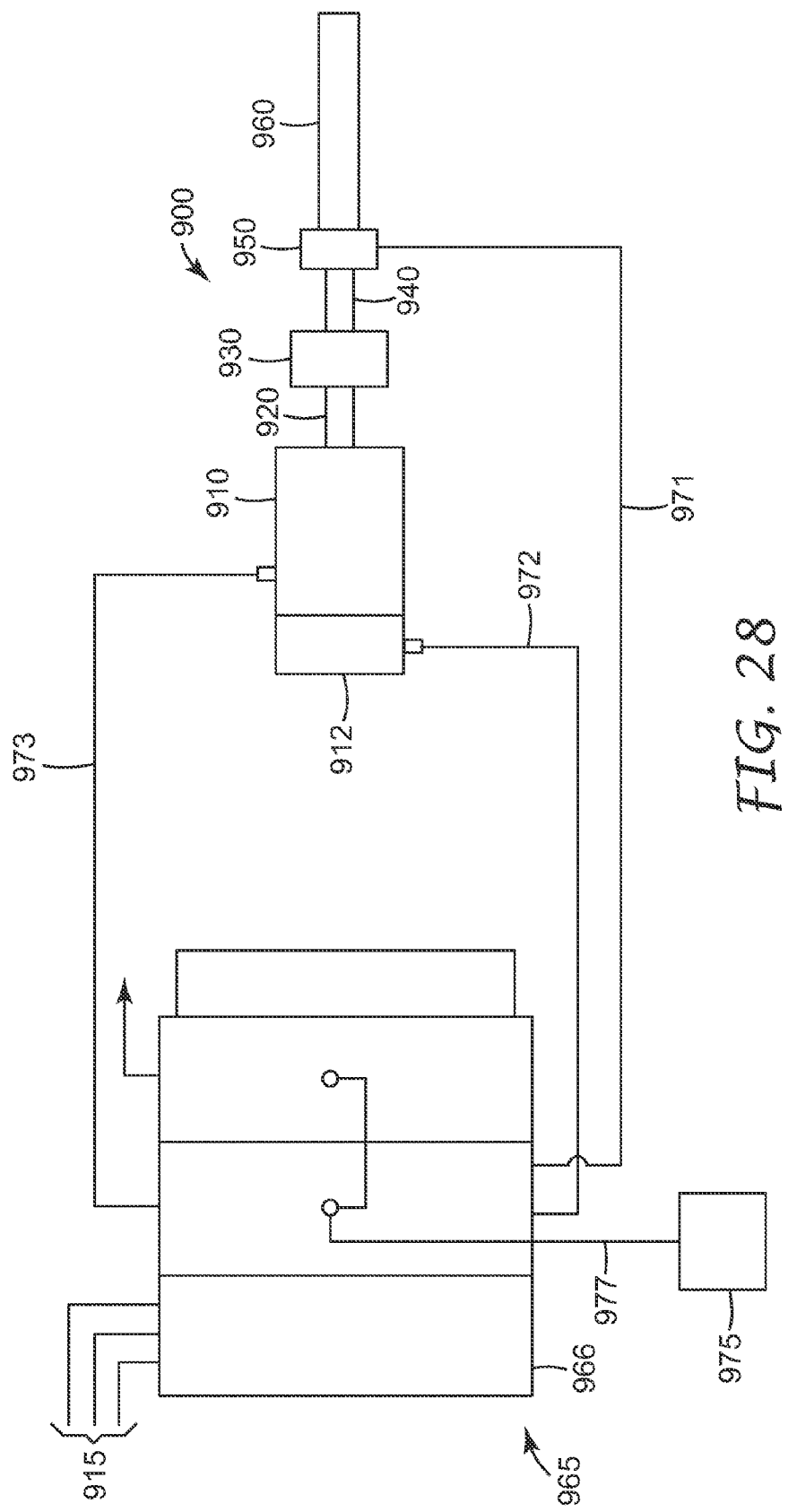
FIG. 28 is a schematic illustration of structure for controlling the registration between rolls in accordance with an embodiment of the disclosure.

Referring to FIG. 28, a schematic of the motor arrangement of FIG. 27, is illustrated as attached to control components. In the example apparatus shown in FIGS. 1-3, a similar set-up would control each motor arrangement 210 and 220. Accordingly, motor arrangement 900 includes a motor 910 including a primary encoder 930 and a drive shaft 920. Drive shaft 920 is coupled to a driven shaft 940 of patterned roll 960 through a coupling 930. A secondary, or load, encoder 950 is coupled to the driven shaft 940.

Motor arrangement 900 communicates with a control arrangement 965 to allow precision control of the patterned roll 960. Control arrangement 965 includes a drive module 966 and a program module 975. The program module 975 communicates with the drive module 966 via a line 977, for example, a SERCOS fiber network. The program module 975 is used to input parameters, such as set points, to the drive module 966. Drive module 966 receives input 480 volt, 3-phase power 915, rectifies it to DC, and distributes it via a power connection 973 to control the motor 910. Motor encoder 912 feeds a position signal to control module 966 via line 972. The secondary encoder 950 on the patterned roll 960 also feeds a position signal back to the drive module 966 via to line 971. The drive module 966 uses the encoder signals to precisely position the patterned roll 960. The control design to achieve the degree of registration is described in detail below.

In the illustrative embodiments shown, each patterned roll is controlled by a dedicated control arrangement. Dedicated control arrangements cooperate to control the registration between first and second patterned rolls. Each drive module communicates with and controls its respective motor assembly.

The control arrangement in the system built and demonstrated by Applicants include the following. To drive each of the patterned rolls, a high performance, low cogging torque motor with a high-resolution sine encoder feedback (512 sine cycles×4096 drive interpolation>>2 million parts per revolution) was used, model MHD090B-035-NG0-UN, available from Bosch-Rexroth (Indramat). Also the system included synchronous motors, model MHD090B-035-NG0-UN, available from Bosch-Rexroth (Indramat), but other types, such as induction motors could also be used.

Each motor was directly coupled (without gearbox or mechanical reduction) through an extremely stiff bellows coupling, model BK5-300, available from R/W Corporation. Alternate coupling designs could be used, but bellows style generally combines stiffness while providing high rotational accuracy. Each coupling was sized so that a substantially larger coupling was selected than what the typical manufacturers specifications would recommend.

Additionally, zero backlash collets or compressive style locking hubs between coupling and shafts are preferred. Each roller shaft was attached to an encoder through a hollow shaft load side encoder, model RON255C, available from Heidenhain Corp., Schaumburg, Ill. Encoder selection should have the highest accuracy and resolution possible, typically greater than 32 arc-sec accuracy. Applicants' design, 18000 sine cycles per revolution were employed, which in conjunction with the 4096 bit resolution drive interpolation resulted in excess of 50 million parts per revolution resolution giving a resolution substantially higher than accuracy. The load side encoder had an accuracy of +/−2 arc-sec; maximum deviation in the delivered units was less than +/−1 arc-sec.

In some instances, each shaft may be designed to be as large a diameter as possible and as short as possible to maximize stiffness, resulting in the highest possible resonant frequency. Precision alignment of all rotational components is desired to ensure minimum registration error due to this source of registration error.

Figure 29:
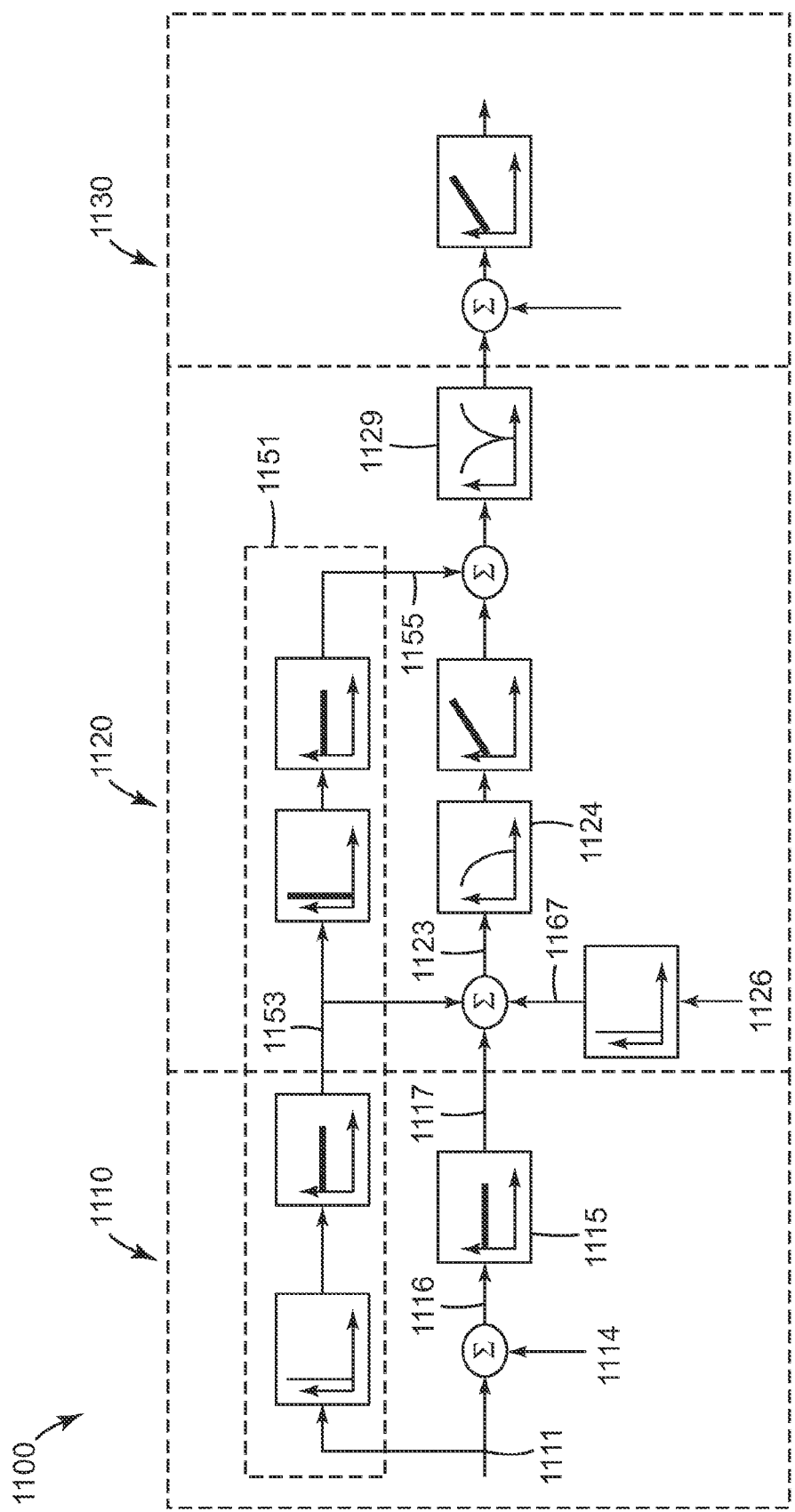
FIG. 29 is a schematic illustration of a control algorithm for controlling registration in accordance with an embodiment of the disclosure.

Referring to FIG. 29, identical position reference commands were presented to each axis simultaneously through a SERCOS fiber network at a 2 ms update rate. Each axis interpolates the position reference with a cubic spline, at the position loop update rate of 250 microsecond intervals. The interpolation method is not critical, as the constant velocity results in a simple constant times time interval path. The resolution is critical to eliminate any round off or numerical representation errors. Axis rollover is also addressed. In some cases, it is important that each axis' control cycle is synchronized at the current loop execution rate (62 microsecond intervals).

The top path 1151 is the feed forward section of control. The control strategy includes a position loop 1110, a velocity loop 1120, and a current loop 1130. The position reference 1111 is differentiated, once to generate the velocity feed forward terms 1152 and a second time to generate the acceleration feed forward term 1155. The feed forward path 1151 helps performance during line speed changes and dynamic correction.

The position command 1111 is subtracted from current position 1114, generating an error signal 1116. The error 1116 is applied to a proportional controller 1115, generating the velocity command reference 1117. The velocity feedback 1167 is subtracted from the command 1117 to generate the velocity error signal 1123, which is then applied to a PID controller. The velocity feedback 1167 is generated by differentiating the motor encoder position signal 1126. Due to differentiation and numerical resolution limits, a low pass Butterworth filter 1124 is applied to remove high frequency noise components from the error signal 1123. A narrow stop band (notch) filter 1129 is applied at the center of the motor—roller resonant frequency. This allows substantially higher gains to be applied to the velocity controller 1120. Increased resolution of the motor encoder also would improve performance. The exact location of the filters in the control diagram is not critical; either the forward or reverse path are acceptable, although tuning parameters are dependent on the location.

A PID controller could also be used in the position loop, but the additional phase lag of the integrator makes stabilization more difficult. The current loop is a traditional PI controller; gains are established by the motor parameters. The highest bandwidth current loop possible will allow optimum performance. Also, minimum torque ripple is desired.

Minimization of external disturbances is important to obtain maximum registration. This includes motor construction and current loop commutation as previously discussed, but minimizing mechanical disturbances is also important. Examples include extremely smooth tension control in entering and exiting web span, uniform bearing and seal drag, minimizing tension upsets from web peel off from the roller, uniform rubber nip roller. In the current design, a third axis geared to the tool rolls is provided as a pull roll to assist in removing the cured structure from the tool.

Web Material

The web material can be any suitable material on which a microreplicated patterned structure can be created. A number of different materials may be used, depending on the ultimate use of the microreplicated patterned structure. If, for example, the microreplicated patterned structure will form a flexible circuit board, the web material may be a metallized polymeric film such as metallized KAPTON.

Coating Material

The liquid from which the microreplicated structures are created can be a curable photocurable material, such as acrylates curable by UV light. One of ordinary skill in the art will appreciate that other coating materials can be used, for example, polymerizable material, and selection of a material will depend on the particular characteristics desired for the microreplicated structures. For example, if a flexible circuit board is being made, the coating material may include a conductive or insulating polymer. In some embodiments, the coating material includes an electroplate masking material and/or nonconductive or insulating polymers.

Examples of coating means that useful for delivering and controlling liquid to the web or patterned roll are, for example, die or knife coating, coupled with any suitable pump such as a syringe or peristaltic pump. One of ordinary skill in the art will appreciate that other coating means can be used, and selection of a particular means will depend on the particular characteristics of the liquid to be delivered to the web or patterned roll.

Examples of curing energy sources are infrared radiation, ultraviolet radiation, visible light radiation, or microwave. One of ordinary skill in the art will appreciate that other curing sources can be used, and selection of a particular web material/curing source combination will depend on the particular article (having microreplicated structures in registration) to be created.

Microreplicated Article

Figure 30:
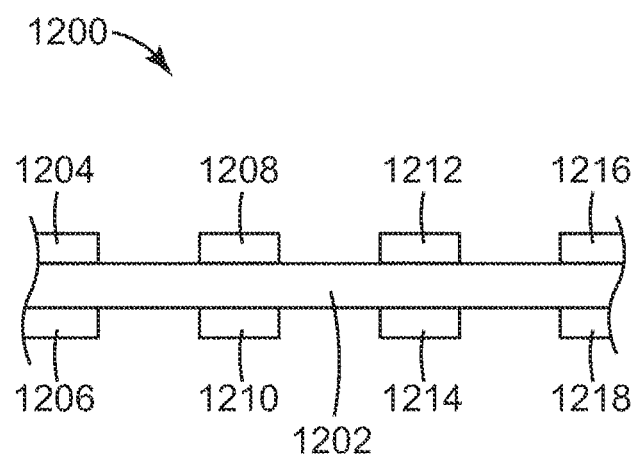
FIG. 30 is a diagrammatic cross-sectional view of an article made in accordance with an embodiment of the disclosure.

FIG. 30 schematically illustrates a contemplated coated microreplicated article 1200 formed according to the methods and using the apparatus described herein. Article 1200 includes a flexible opaque web 1202 and a number of schematic elements disposed on either side of opaque web 1202. Element 1204 is disposed opposite element 1206. Similarly, element 1208, element 1212 and element 1216 are disposed opposite element 1210, element 1214 and element 1218, respectively. It should be noted that these elements can be considered as generically representing a number of different potential elements. These elements may be circuitry, for example. In some embodiments, the microreplicated pattern includes an electroplate mask that can pass through an additive circuit plating step.

In some embodiments, such as that illustrated, there may be little or no lands between adjacent elements. For example, there may be little or no coated material remaining on opaque web 1202 between element 1204 and element 1208. This may have advantages if, for example, the coated material is an electrically conductive material or an electroplate mask. In some embodiments, an additional washing step can remove uncured material from the microreplicated pattern to produce a microreplicated features having no land areas and separated from one another. In other instances, article 1202 may include lands, i.e. coated material remaining on opaque web 1202 between adjacent elements.

EXAMPLE

FIGS. 4-13 illustrate an additive process for forming a patterned roll much like patterned roll of FIG. 3. Quartz tubes 3 inches long and 3 inches in radius were cleaned with water, acetone and methyl ethyl ketone (MEK), and were then placed under a UV lamp for 15 minutes. The quartz tubes were then mounted on a rotating table in a high vacuum sputter chamber, and the pressure within the chamber was slowly reduced to $1 \times 10^{-6}$ Torr over a period of one hour. A strip of chrome plated steel previously mounted within the chamber was electrically connected to an arc welder. The arc welder passed a current through the metal strip and the metal strip was thus heated to red hot. The rotating quartz tubes were washed by the resulting IR radiation for 10 minutes.

Figure 4:
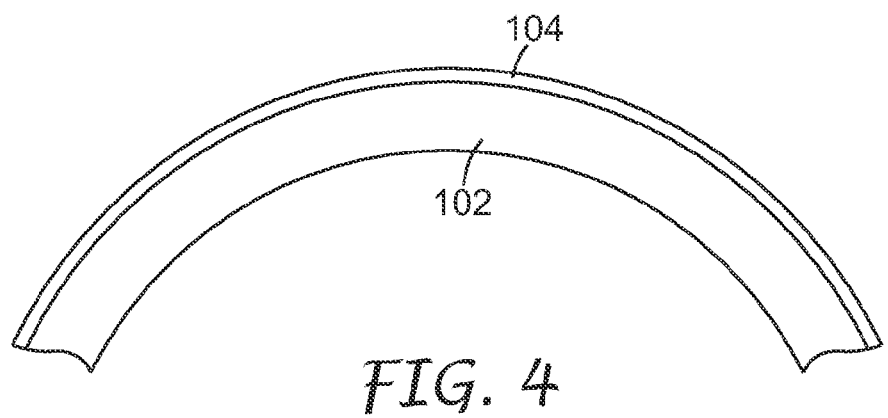
FIGS. 4-13 demonstrate an illustrative but non-limiting method of forming the patterned roll of FIG. 3 in accordance with an embodiment of the disclosure.

Once the quartz tubes were cleaned, a quartz cylinder 102 as seen in FIG. 4 was sputtered with a thin layer 104 of chrome, which acts as an adhesion layer between the quartz and the nickel layer to follow.

Figure 5:
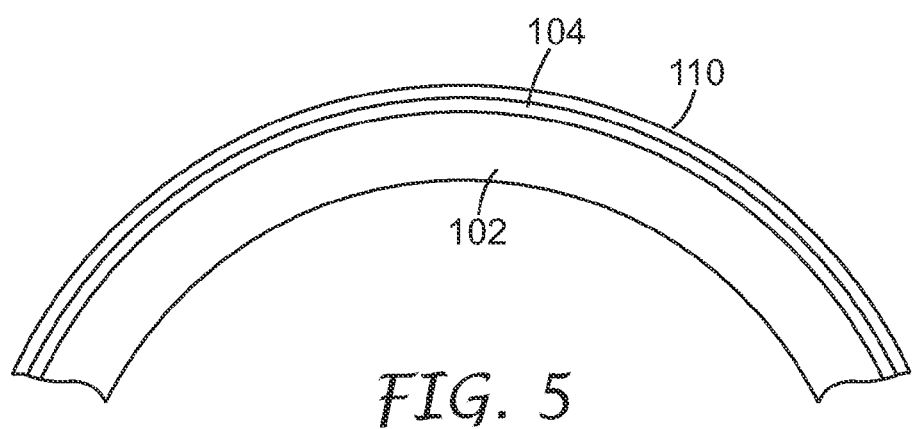

Next, and as shown schematically in FIG. 5, a nickel metallization layer 110 was sputtered onto the chrome tie layer 104.

Figure 6:
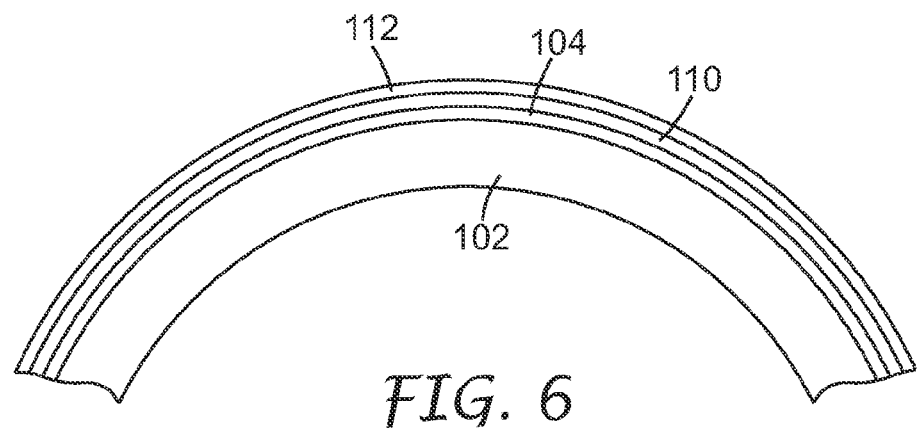

Next, and as shown schematically in FIG. 6, a protective copper layer 112 was applied over the nickel metallization layer 110. The copper layer 112 was a sacrificial layer that was intended to protect the nickel layer 110 from contamination and oxidation during subsequent processing steps.

Figure 7:
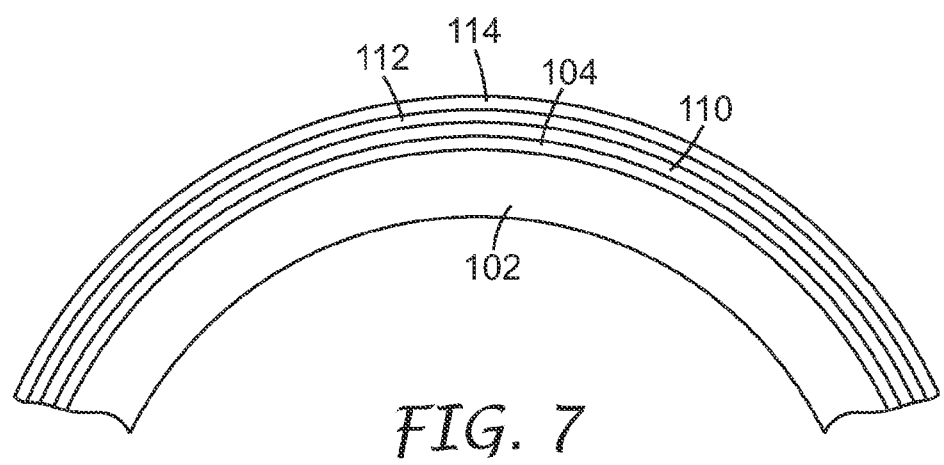

Next, and as shown schematically in FIG. 7, a photoresist (SC Resists, Arch Semiconductor Photopolymers Company) layer 114 has been added on top of the copper layer 112. The height of the photoresist layer 114 ultimately sets the height of the features being formed on quartz cylinder 102. In the Example, the photoresist layer 114 was formed to be 50 micrometers thick, and was softbaked at 115 degrees Celsius for 30 seconds prior to exposure.

Figure 8:
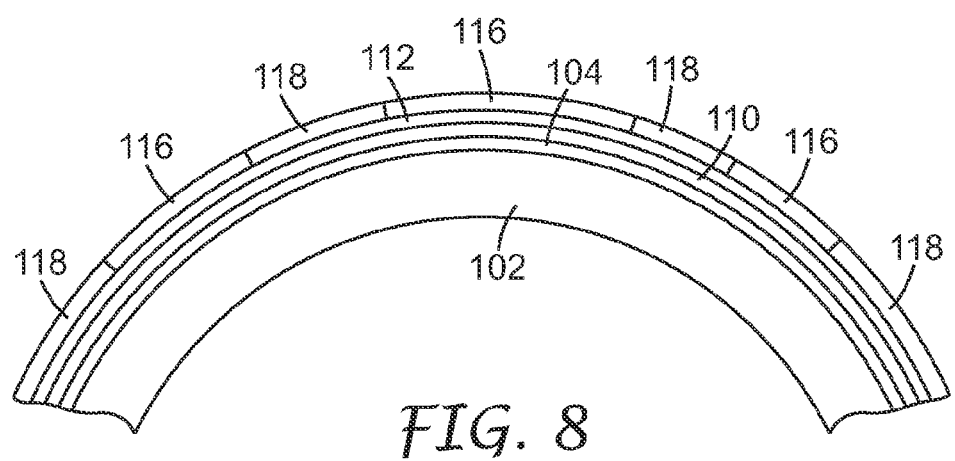

Next, and as shown schematically in FIG. 8, the photoresist layer 114 was patterned by shining light in a desired pattern onto the photoresist layer 114. Consequently, the photoresist layer 114 now has portions 116 that will remain, and portions 118 that will be removed after developing.

Figure 9:
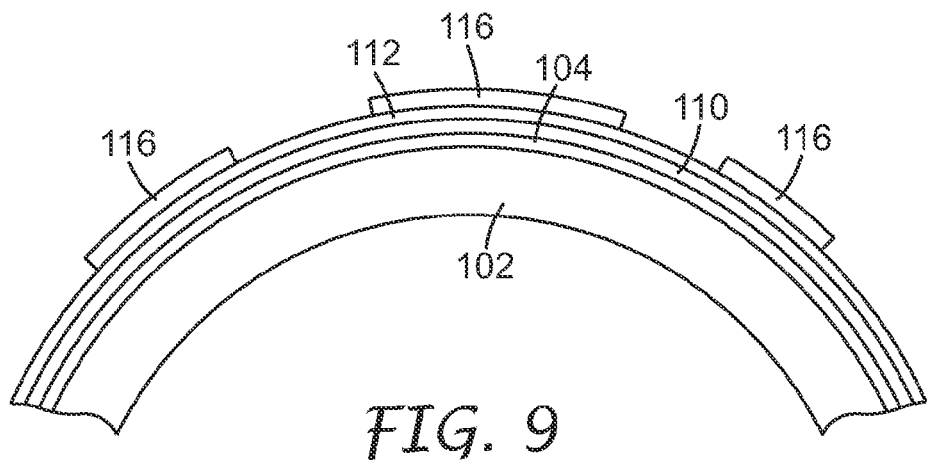

Next, and as shown schematically in FIG. 9, the photoresist was developed. After sitting for at least 30 minutes, the photoresist was subjected to a post exposure bake at 115 degrees Celsius for 1 minute. The photoresist was then developed via exposure to developing solution for 30 to 60 seconds. Consequently, resist portions 116 remain on copper layer 112 while resist portions 118 have been removed.

Figure 10:
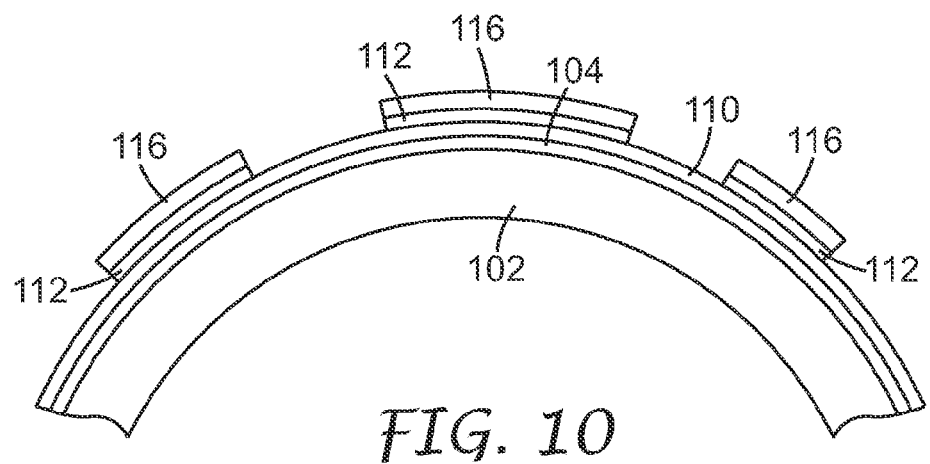

Next, and as shown schematically in FIG. 10, the exposed portions of copper layer 112 were removed in an etching process. Sodium persulfate was used to remove the exposed copper because sodium persulfate reacts quickly with copper but slowly with the chrome underlying the copper, as it is desirable to keep the chrome layer as thick as possible.

Figure 11:
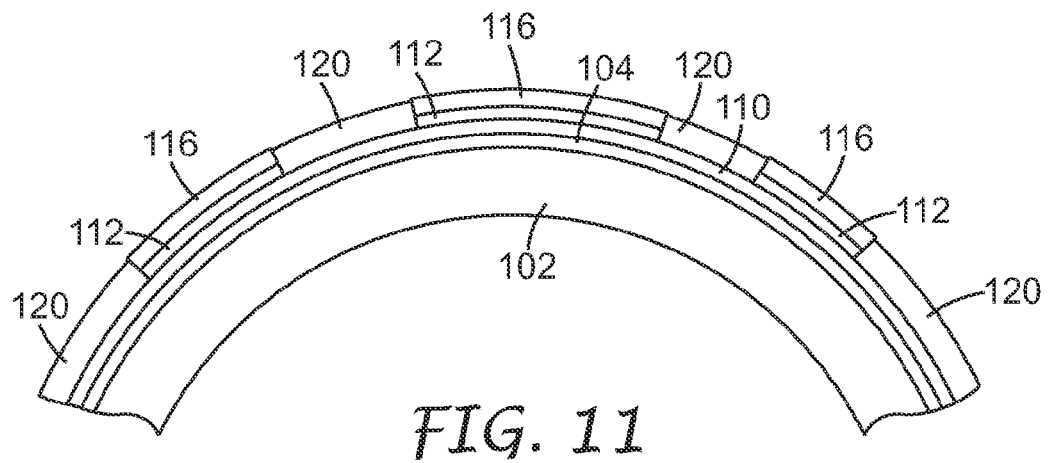

Next, and as shown schematically in FIG. 11, chrome sections 120 were plated onto the freshly exposed chrome layer 110, in between resist regions 116. Chrome sections 120 were plated using low current densities on the order of 1 mA/17 mm$^2$. As the current density increases, even at levels as low as 20 mA/17 mm$^2$, either internal stress was high, causing the chrome to peel off, or severe pitting occurred. The geometry of chrome sections 120 were determined by resist regions 116.

Figure 12:
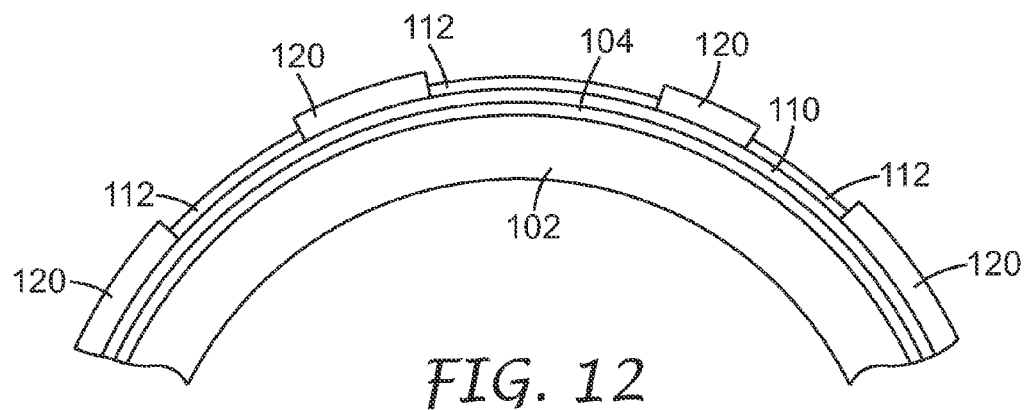
Figure 13:
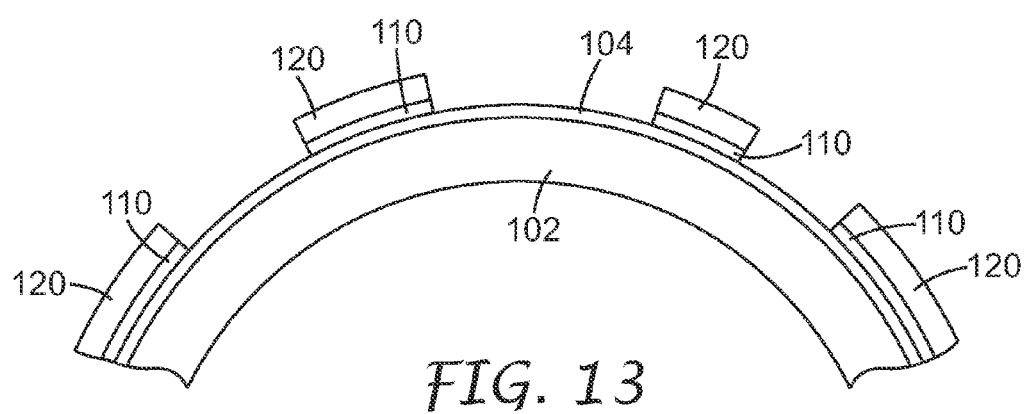

Next, and as shown schematically in FIG. 12, the remaining cured photoresist, in resist regions 116, were removed using a basic solution. Finally, and as shown schematically in FIG. 13, the remaining copper layer 112 was removed using a sodium persulfate bath as discussed above. The resulting patterned roll has opaque regions corresponding to nickel 110 and chrome sections 120, and transparent regions corresponding to where tie layer 104 is not covered by opaque material.

The disclosure should not be considered limited to the particular examples described above, but rather should be understood to cover all aspects of the disclosure as set out in the attached claims. Various modifications, equivalent processes, as well as numerous structures to which the disclosure can be applicable will be readily apparent to those of skill in the art upon review of the instant specification.

We claim:

1. A method for patterning an opaque web having a first side and a second side, the method comprising steps of:
    patterning a curable material onto a web having a first side and a second side with a first patterned roll and a second patterned roll, the first patterned roll comprising a first plurality of raised opaque regions disposed on a transparent substrate and the second patterned roll comprising a second plurality of raised opaque regions disposed on a transparent substrate; and
    directing ultraviolet radiation at least partially through the first patterned roll and second patterned roll, thereby curing the curable material on the first side of the web to form a first pattern and curing the curable material on the second side of the web to form a second pattern;
    wherein the first and second sides of the web are patterned while the web is in continuous motion such that the first and second patterns are maintained in continuous registration to within 100 micrometers.

2. The method of claim 1, wherein the first and second patterns are transferred to first and second sides of the web in registration to within 10 micrometers.

3. The method of claim 1, wherein disposing curable material onto the web comprises:
    disposing curable material onto the first patterned roll prior to the first side of the web contacting the first patterned roll; and
    disposing curable material onto the second patterned roll prior to the second side of the web contacting the second patterned roll.

* * * * *

UNITED STATES PATENT AND TRADEMARK OFFICE
CERTIFICATE OF CORRECTION

PATENT NO. : 8,968,629 B2  
APPLICATION NO. : 14/270838  
DATED : March 3, 2015  
INVENTOR(S) : Huizinga et al.

Page 1 of 1

It is certified that error appears in the above-identified patent and that said Letters Patent is hereby corrected as shown below:

Title page item (71), Column 1 (Applicant)
Lines 2-3, delete "(US); Thelma E. Hunter, St. Paul, MN (US)" and insert -- (US) --, therefor.

Title page item (72), Column 1 (Inventors)
Line 3, delete "ME" and insert -- MN --, therefor.

Signed and Sealed this
Fourth Day of August, 2015

Michelle K. Lee
*Director of the United States Patent and Trademark Office*